US010995192B2

(12) United States Patent
Zhou et al.

(10) Patent No.: US 10,995,192 B2
(45) Date of Patent: May 4, 2021

(54) COMPOSITE MATERIAL REINFORCED BY FOAMED SKELETON AND PREPARATION METHOD AND USES THEREOF

(71) Applicant: CENTRAL SOUTH UNIVERSITY, Hunan (CN)

(72) Inventors: Kezhao Zhou, Hunan (CN); Qiuping Wei, Hunan (CN); Li Ma, Hunan (CN); Long Zhang, Hunan (CN); Zhiming Yu, Hunan (CN)

(73) Assignee: CENTRAL SOUTH UNIVERSITY, Hunan (CN)

( * ) Notice: Subject to any disclaimer, the term of this patent is extended or adjusted under 35 U.S.C. 154(b) by 124 days.

(21) Appl. No.: 16/086,608

(22) PCT Filed: Feb. 22, 2017

(86) PCT No.: PCT/CN2017/074397
§ 371 (c)(1),
(2) Date: Dec. 27, 2018

(87) PCT Pub. No.: WO2017/161993
PCT Pub. Date: Sep. 28, 2017

(65) Prior Publication Data
US 2019/0112445 A1 Apr. 18, 2019

(30) Foreign Application Priority Data

Mar. 21, 2016 (CN) .......................... 201610161232.4
Mar. 21, 2016 (CN) .......................... 201610162661.3
(Continued)

(51) Int. Cl.
*C08J 9/35* (2006.01)
*C08K 3/04* (2006.01)
(Continued)

(52) U.S. Cl.
CPC .................. *C08J 9/35* (2013.01); *C01B 32/16* (2017.08); *C01B 32/186* (2017.08); *C01B 32/26* (2017.08);
(Continued)

(58) Field of Classification Search
CPC ........ C08J 9/35; C22C 1/08; C22C 2026/002; C01B 32/182; C23C 16/27; C08K 3/04; C08K 3/042
See application file for complete search history.

(56) References Cited

U.S. PATENT DOCUMENTS

2004/0146736 A1    7/2004  Ivanov et al.
2004/0241532 A1*  12/2004  Kim ...................... B82Y 30/00
                                                        429/517
(Continued)

FOREIGN PATENT DOCUMENTS

CN           1896171         1/2007
CN         101906549        12/2010
(Continued)

OTHER PUBLICATIONS

Translation of WO 00/32335, Schreiner et al., Jun. 8, 2000. (Year: 2000).*
(Continued)

*Primary Examiner* — Hai Vo
(74) *Attorney, Agent, or Firm* — JCIPRNET

(57) ABSTRACT

A foamed skeleton reinforced composite, comprising a foamed skeleton and a matrix material. The foamed skeleton is selected from at least one of a metal foamed skeleton, an inorganic non-metal foamed skeleton, and an organic foamed skeleton. The matrix material is selected from a metal or a polymer.

11 Claims, 4 Drawing Sheets

(30) Foreign Application Priority Data

| Oct. 21, 2016 | (CN) | 201610919507.6 |
| Oct. 21, 2016 | (CN) | 201610919637.X |
| Oct. 21, 2016 | (CN) | 201610920318.0 |

(51) Int. Cl.

| C08K 9/02 | (2006.01) |
| C23C 16/27 | (2006.01) |
| C22C 1/08 | (2006.01) |
| C08L 33/12 | (2006.01) |
| C01B 32/16 | (2017.01) |
| C08K 3/08 | (2006.01) |
| C01B 32/26 | (2017.01) |
| C01B 32/186 | (2017.01) |
| C08K 5/00 | (2006.01) |
| C01B 32/182 | (2017.01) |
| C01B 32/28 | (2017.01) |

(52) U.S. Cl.
CPC ............ *C08K 3/04* (2013.01); *C08K 3/042* (2017.05); *C08K 3/08* (2013.01); *C08K 5/0066* (2013.01); *C08K 9/02* (2013.01); *C08L 33/12* (2013.01); *C22C 1/08* (2013.01); *C23C 16/27* (2013.01); *C01B 32/182* (2017.08); *C01B 32/28* (2017.08); *C08J 2323/06* (2013.01); *C08J 2323/12* (2013.01); *C08J 2325/06* (2013.01); *C08J 2327/18* (2013.01); *C08J 2361/28* (2013.01); *C08J 2363/00* (2013.01); *C08J 2377/00* (2013.01); *Y10T 428/249957* (2015.04); *Y10T 428/249986* (2015.04)

(56) References Cited

U.S. PATENT DOCUMENTS

| 2013/0196175 | A1* | 8/2013 | Levit | B32B 37/02 |
| | | | | 428/688 |
| 2017/0160063 | A1* | 6/2017 | Meeks | F42B 12/22 |

FOREIGN PATENT DOCUMENTS

| CN | 104073673 | 10/2014 | |
| CN | 104789194 | 7/2015 | |
| CN | 105112754 | 12/2015 | |
| CN | 105603248 | 5/2016 | |
| CN | 105603265 | 5/2016 | |
| CN | 105671354 | 6/2016 | |
| CN | 105695831 | 6/2016 | |
| CN | 105733192 | 7/2016 | |
| CN | 105779804 | 7/2016 | |
| CN | 105779805 | 7/2016 | |
| CN | 105792605 | 7/2016 | |
| CN | 106497522 | 3/2017 | |
| WO | WO-0032335 A1 * | 6/2000 | B22D 19/02 |
| WO | WO-2014118547 A1 * | 8/2014 | H01M 4/667 |

OTHER PUBLICATIONS

"International Search Report (Form PCT/ISA/210)", dated Jun. 2, 2017, with English translation thereof, pp. 1-6.

\* cited by examiner

COMPOSITE MATERIAL REINFORCED BY FOAMED SKELETON AND PREPARATION METHOD AND USES THEREOF

CROSS-REFERENCE TO RELATED APPLICATION

This application is a 371 of international application of PCT application serial no. PCT/CN2017/074397, filed on Feb. 22, 2017, which claims the priority benefit of China application no. 201610161232.4, filed on Mar. 21, 2016; the priority benefit of China application no. 201610162661.3, filed on Mar. 21, 2016; the priority benefit of China application no. 201610919637.X, filed on Oct. 21, 2016; the priority benefit of China application no. 201610920318.0, filed on Oct. 21, 2016; and the priority benefit of China application no. 201610919507.6, filed on Oct. 21, 2016. The entirety of each of the above-mentioned patent applications is hereby incorporated by reference herein and made a part of this specification.

BACKGROUND

1. Field of the Invention

The invention discloses a foamed skeleton reinforced composite material and preparation method and application thereof, which belongs to the technical field of composite material preparation.

2. Description of Related Art

Diamond has highly thermal conductivity (up to 2200 W/(m·K) at room temperature), extreme hardness, wear resistant and other excellent physical properties. Carbon nanotubes and graphene are novel carbon nanomaterials discovered in recent years, both of which have highly thermal conductivity and excellent electrical and mechanical properties. Therefore, a single or mixed phase of diamond, graphene, carbon nanotubes can be reinforcing with a metal as a reinforcing phase to obtain better thermal conductivity, electrical conductivity and mechanical properties to meet the requirements of different fields.

At present, the main domestic and foreign research ideas are to increase the content of diamond particles and improve the composite interface of diamond particles/metals, and both have achieved good results. However, the diamond particles (thermal conductivity is 1800-2200 W/(m·K)) in this composite structure are like isolated heat-conducting islands connected by metal (Al: 237 W/(m·K), Cu: 398 W/(m·K)), which not only increases the number of two-phase interfaces, but also makes it difficult to produce synergistic effects and fully exert the excellent thermal conductivity of the diamond.

As the frequency of electronic devices is getting higher and higher, the power is getting bigger and bigger, and the heat is getting higher and higher, the performance of electronic packaging materials and electronic substrate materials have been challenged. So, it is imperative to develop a new generation of highly thermal conductivity packaging materials. Currently, the most effective method is to add highly thermal conductivity inorganic filler to the molding material. Many foreign research teams have obtained plastic sealing materials with a thermal conductivity greater than 4 W/(m·K), but considerable gaps remain, compared with ceramics and metal materials. Based on the existing research data, almost all the methods are directly mixed and filled with materials. Although the intrinsic thermal conductivity of the filler is very high (the thermal conductivity of some inorganic fillers can even reach $10^4$ times higher than the organic materials), the modification effect on the thermal conductivity of organic materials is not obvious (only tens to hundreds of times of organic materials can be achieved).

The random filling of thermal conductive particles into the polymer is difficult to form an effective thermal conducting network, so that a large filling amount is often required to enable a small increase in the thermal conductivity of the material, and the final thermal conductivity is much lower than pure conductive material. The primary cause of such poor thermal conductivity improvement is the high contact thermal resistance between the particles. If added thermal conductive particles are organized to form a spatially continuous interpenetrated structure in the composite material, the heat transfer efficiency will be greatly improved.

The network interpenetrating structure is that the reinforcing phase and the matrix phase both are continuously distributed in the space, so that the significant influence of the composite interface on the thermal properties can be reduced, and the high reinforcing efficiency of the reinforcing phase can be fully exerted without reducing the good plasticity and toughness of the matrix. However, it is very difficult to prepare the network interpenetrating structure for the traditional particle reinforced composite materials, especially for the non-metal reinforcing phase with high brittleness, modulus and hardness.

The Chinese Invention Patent CN105112754A proposes a three-dimensional network diamond skeleton reinforced metal matrix composite material and a preparation method of it, and the substrate of the three-dimensional metal network skeleton is prepared by mechanical processing or woven by metal wires. However, the conventional machining method belongs to multi-dimensional machining, which has many processing steps and high cost. In addition, mechanical processing is subject to the constraints of traditional mechanical processing methods and equipment, making it difficult to control the internal aperture and connectivity of the three-dimensional porous skeleton. The method of metal wire weaving has the problems that the three-dimensional pores contain gaps and the process flow is complicated and so on.

SUMMARY

A purpose of this invention is to overcome the disadvantage of low thermal conductivity in diamond particle reinforced composite materials and provide a preparation method and application of composite materials reinforced by foamed skeletons. Foamed skeletons with highly thermal conductivity as the reinforcements are constructed by chemical vapor deposition (CVD) technology, and compounded with a matrix, to turn the isolated islands for thermal conduction into a channel with highly thermal conductivity. The thermal conduction efficiency of the materials with highly thermal conductivity in the composite materials can be greatly improved.

In the composite material reinforced by a foamed skeleton of this invention, a composite material comprises a foamed skeleton and a matrix material. The foamed skeleton is selected from at least one of a foamed metal skeleton, a foamed inorganic non-metallic skeleton, and a foamed organic skeleton; or the foamed skeleton is selected from a foam metaled skeleton or a foamed ceramic skeleton or a foamed carbon skeleton. The matrix material is selected from a metal material or a polymer.

In the composite material reinforced by a foamed skeleton of this invention, wherein the metal matrix is selected from one of metal copper, aluminum, magnesium, silver, titanium, cobalt, nickel, tungsten, molybdenum, tantalum, niobium or one of copper-based alloys, aluminum-based alloys, magnesium-based alloys, silver-based alloys, titanium-based alloys, cobalt-based alloys, nickel-based alloys, tungsten-based alloys, molybdenum-based alloys, ruthenium-based alloys, or ruthenium-based alloys. When the matrix material is a polymer, the matrix material is selected from paraffin, or from one of the thermoplastic polymers consisting of polyethylene, polypropylene, polystyrene, polyvinyl chloride, polytetrafluoroethylene, nylon, polycarbonate, polymethyl methacrylate, ethylene glycol, polyterephthalic acid, polyformaldehyde, polyamide and polysulfone, or from one of the thermosetting polymers consisting of epoxy resin, phenolic resin, urea-formaldehyde resin, amino resin, melamine resin, unsaturated polyester resin, silicone rubber, foamed polystyrene and polyurethane.

In the composite material reinforced by a foamed metal skeleton of this invention, wherein the foamed metal skeleton is selected from one of nickel foam, copper foam, titanium foam, cobalt foam, tungsten foam, molybdenum foam, chromium foam, iron-nickel foam and aluminum foam. The foamed inorganic non-metallic skeleton, is selected from one of carbon foam, $Al_2O_3$ foam, $ZrO_2$ foam, SiC foam, $Si_3N_4$ foam, BN foam, $B_4C$ foam, AlN foam, WC foam or $Cr_7C_3$ foam. The foamed organic skeleton is selected from one of sponge, polyurethane (PUR), polystyrene (PS), polyvinyl chloride (PVC), polyethylene (PE), phenolic resin (PF), etc.

In the composite material reinforced by a foamed skeleton of this invention, the pore size of the foam is 0.01-10 mm; and the porosity is 20-99% or 40-99%; the foam pores distribute evenly or randomly; the foamed skeleton has a planar structure or a three-dimensional structure.

In the composite material reinforced by a foamed skeleton of this invention, wherein the surface of the foamed skeleton is provided with a reinforcing layer.

In the composite material reinforced by a foamed skeleton of this invention, wherein the reinforcing layer is selected from one of a diamond film, a graphene film, a carbon nanotubes film, a diamond/graphene film, a diamond/carbon nanotubes film, a graphene/carbon nanotubes film and a diamond/graphene/carbon nanotubes film. The thickness of the reinforcing layer is 0.34 nm-800 μm.

In the composite material reinforced by a foamed skeleton of this invention, the diamond/graphene film refers to a diamond film with graphene in-situ grown on its surface where graphene is perpendicular to the surface of the diamond and form a graphene wall; or graphene is grown on the surface of the diamond, and the graphene is spread out on the surface of the diamond and form a film, and the graphene is monolayer or multilayer.

The diamond/carbon nanotubes film refers to the catalytic growth of carbon nanotubes on the surface of the diamond, and the carbon nanotubes form a carbon nanotubes forest perpendicular to the surface of the diamond or the boron-doped or nitrogen-doped diamond.

The graphene/carbon nanotubes film refers to the catalytic growth of carbon nanotubes on the surface of graphene, and the carbon nanotubes is perpendicular to the surface of the graphene to form carbon nanotubes forest.

The carbon nanotubes/graphene refers to the catalytic growth of graphene on the surface of carbon nanotubes, and graphene is perpendicular to the surface of carbon nanotubes and form a graphene wall; or the catalytic growth of graphene on the surface of carbon nanotubes, and graphene is spread out on the surface of the diamond to form a film. The graphene is a monolayer or multilayer.

The diamond/graphene/carbon nanotubes film refers to the growth of carbon nanotubes forest after growing graphene on the surface of diamond, and the graphene is spread out to form a film on the surface of the diamond and the carbon nanotubes are perpendicular to the surface of diamond to form a carbon nanotubes forest.

Diamond/carbon nanotube/graphene refers to the catalytic growth of carbon nanotubes forest on the surface of diamond, and then graphene walls are grown on the surface of the carbon nanotubes.

In the composite material reinforced by a foamed skeleton of this invention, after arranging the first modifying layer on the surface of the foamed skeleton substrate, a reinforcing layer is arranged on the surface of the modified foamed skeleton substrate.

In the composite material reinforced by a foamed skeleton of this invention, wherein the modifying layer is selected from one of niobium, titanium, nickel, tungsten, molybdenum, chromium, tantalum, platinum, silver and silicon or a combination thereof.

In the composite material reinforced by a foamed skeleton of this invention, boron or nitrogen is doped in the reinforcing layer to improve the electrical conductivity of diamond.

In the composite material reinforced by a foamed skeleton of this invention, in the reinforcing layers, the diamond is micro-crystalline or nano-crystalline, and the grain size is 1 nm-800 μm, preferably 5 nm to 300 μm.

In the composite material reinforced by a foamed skeleton of this invention, the surface of the reinforcing layer is etched to further increase the specific surface area of the reinforcing layer. The surface etching of the reinforcing layer is performed by using active hydrogen atoms or plasma or metal catalyzed etching, micro-pores and/or cones uniformly distribute on the surface of the reinforcing layer.

In the composite material reinforced by a foamed skeleton of this invention, the matrix material is fortified with reinforcing particles. The reinforcing particles are selected from at least one of highly thermal conductivity particles, super hard and wear-resistant particles, and conductive particles. The highly thermal conductivity particles are selected from at least one of diamond powders, graphene, carbon nanotubes, graphene-coated diamond microspheres, carbon nanotubes-coated diamond microspheres and carbon nanotubes-coated graphene. The super hard and wear-resistant particles are selected from at least one of the diamond powders, SiC, TiC, TiN, AlN, $Si_3N_4$, $Al_2O_3$, BN, WC, MoC and $Cr_7C_3$. The conductive particles are selected from at least one of graphite, carbon nanotubes, and graphene.

In the composite material reinforced by a foamed skeleton of this invention, in the composite material, the volume fraction of each component is: the volume fraction of the matrix material is 10-90%, the volume fraction of the foamed skeleton is 5-80%, the volume fraction of the reinforcing particles is 0-30%, and the sum of the volume fraction of each component is 100%.

In the body of a foamed skeleton reinforcement, the volume fraction of the reinforcing layer is 0.1-80%, and the volume fraction of the foamed skeleton is 0.1-20%.

In the composite material reinforced by a foamed skeleton of this invention, in the substrate, the foamed skeleton is a single-body reinforcement or multi-body array reinforcement. The multi-body array reinforcement refers to the foamed skeleton is parallel distributed in the matrix in a sheet-like or a strip-like way.

A preparation method of the composite material reinforced by a foamed skeleton of this invention comprises the following steps:

Step 1:

After cleaned and dried, a metal layer or a composite metal layer of niobium, nickel, copper, tungsten, molybdenum, titanium, silver and chromium is deposited on a substrate of the formed skeleton. After depositing a modifying layer on the surface of the foamed skeleton, the modifying foamed skeleton is obtained.

Step 2:

The foamed skeleton obtained from step 1 is put into a suspension of nano-crystalline and/or micro-crystalline diamond particles, by the method selected from one of ultrasonic oscillation, spray atomization and electrostatic adsorption, the diamond seeds are planted on the surface of foamed skeleton with a modifying layer, and the foamed skeleton substrate embedded with numerous nano-crystalline and/or micro-crystalline diamond particles inside the pores is obtained. Then a reinforcing layer of a diamond film, a graphene film or a carbon nanotubes film is evenly deposited by CVD on the surface of the foamed skeleton or the seeded diamond particles. The deposition parameters are:

CVD parameters of diamond: the mass flow ratio of a carbon-containing gas is 0.5-10%; the growth temperature is 600-1000° C., and the growth pressure is $10^3$-$10^4$ Pa;

CVD parameters of graphene: the mass flow ratio of carbon-containing gas is 0.5-80%; the growth temperature is 400-1200° C., the growth pressure is 5-$10^5$ Pa; the plasma current density is 0-50 mA/cm$^2$; the magnetic field intensity in the deposition region is 100 G to 30 T;

CVD parameters of carbon nanotubes: the mass flow ratio of carbon-containing gas is 5-50%; the growth temperature is 400-1300° C., and the growth pressure is $10^3$-$10^5$ Pa; the plasma current density is 0-30 mA/cm$^2$; the magnetic field intensity in the deposition area is 100 G to 30 T;

or

After cleaned, dried the foamed skeleton obtained from step 1 and planted the foamed skeleton with diamond seeds, the surface of the foamed skeleton is deposited with reinforcing layers by chemical vapor deposition, and the reinforcing layer is selected from a diamond/graphene film, a diamond/carbon nanotubes film, a graphene/carbon nanotubes film, a carbon nanotubes/graphene film, a diamond/graphene/carbon nanotubes film, and diamond/carbon nanotubes/graphene;

In the deposition process, plasma assisted growth is applied on the substrate of the foamed skeleton, and the plasma is confined to the near surface of the foamed skeleton by adding magnetic field at the bottom of the substrate. The bombardment of the plasma on the surface of the foamed skeleton is strengthened, and thus the deposition rate is increased and the growth direction of the deposition is controlled. The deposition parameters are:

Diamond/Carbon Nanotubes Film:

Firstly, diamond is deposited on the surface of the substrate by chemical vapor deposition, the deposition parameters are: the mass flow ratio of carbon-containing gas is 0.5-10.0%; the growth temperature is 600-1000° C., the growth pressure is $10^3$-$10^4$ Pa. Then, a catalytic layer of nickel, copper, cobalt or a composite catalytic layer thereof is deposited on the surface of the diamond by electroplating, electroless plating, evaporation, magnetron sputtering, chemical vapor deposition or physical vapor deposition. Finally, the carbon nanotubes are deposited, and the deposition parameters of carbon nanotubes are: the mass flow ratio of carbon-containing gas is 5-50%; the growth temperature is 400-1300° C., the growth pressure is $10^3$-$10^5$ Pa; the plasma current density is 0-30 mA/cm$^2$; and the magnetic field intensity in the deposition region is 100 G to 30 T.

Deposition of Diamond/Graphene Film:

Firstly, diamond is deposited on the surface of the substrate by chemical vapor deposition, and the deposition parameters are: the mass flow ratio of carbon-containing gas is 0.5-10.0%; the growth temperature is 600-1000° C., the growth pressure is $10^3$-$10^4$ Pa. Then, graphene walls are deposited on the surface of the diamond. Graphene grows perpendicular to the surface of the diamond to form graphene walls, or graphene is grown on the surface of the diamond to form a graphene film spread out on the surface of the diamond. The graphene is a monolayer or multilayer. The deposition parameters are: the mass flow ratio of carbon-containing gas is 0.5-80%, the growth temperature is 400-1200° C., the growth pressure is 5-$10^5$ Pa, the plasma current density is 0-50 mA/cm$^2$, and the magnetic field intensity in the deposition region is 100 G to 30 T. Or Firstly, diamond is deposited on the surface of the substrate by chemical vapor deposition, and the deposition parameters are: the mass flow ratio of carbon-containing gas is 0.5-10.0%; the growth temperature is 600-1000° C., the growth pressure is $10^3$-$10^4$ Pa. Then, a catalytic layer of nickel, copper, cobalt or a composite catalytic layer thereof is deposited on the surface of the diamond by electroplating, electroless plating, evaporation, magnetron sputtering, chemical vapor deposition or physical vapor deposition. Finally, graphene is deposited on the surface of the diamond with the catalytic layer. The graphene is spread out on the surface of the diamond to form a film, and the graphene is a monolayer or multilayer. The deposition parameters are: the mass flow ratio of carbon gas is 0.5-80%; the growth temperature is 400-1200° C., and the growth pressure is 5-$10^5$ Pa; the plasma current density is 0-50 mA/cm$^2$; and the magnetic field intensity in the deposition area is 100 G to 30 T.

Deposition of Graphene/Carbon Nanotubes Film:

Firstly, the graphene wall is deposited on the surface of substrate by chemical vapor deposition; the deposition parameters are: the mass flow ratio of carbon-containing gas is 5-80%; the growth temperature is 400-1200° C., the growth pressure is 5-$10^5$ Pa; the plasma current density is 0-50 mA/cm$^2$; the magnetic field intensity in the deposition area is 100 G to 30 T. Then, a catalytic layer of nickel, copper, cobalt or a composite catalytic layer thereof is deposited on the surface of the diamond by electroplating, electroless plating, evaporation, magnetron sputtering, chemical vapor deposition or physical vapor deposition. Finally, carbon nanotubes are deposited on the surface of the graphene; the deposition parameters are: the mass flow ratio of carbon-bearing gas is 5-80%; the growth temperature is 400-1200° C.; the growth pressure is 5-$10^5$ Pa; the plasma current density is 0-50 mA/cm$^2$; and the magnetic field intensity in the deposition area is 100 G to 30 T. Or Firstly, a catalytic layer of nickel, copper, cobalt or a composite catalytic layer thereof is deposited on the surface of the diamond by electroplating, electroless plating, evaporation, magnetron sputtering, chemical vapor deposition or physical vapor deposition. Then, the graphene wall is deposited on the substrate by chemical vapor deposition; the deposition parameters are: the mass flow ratio of carbon-containing gas is 5-80%, the growth temperature is 400-

1200° C., the growth pressure is 5-10⁵ Pa, the plasma current density is 0-50 mA/cm², the magnetic field intensity in deposition region is 100 G to 30 T. Then, carbon nanotubes are deposited on the surface of graphene; the deposition parameters are: the mass flow ratio of carbon-containing gas is 5-80%, the growth temperature is 400-1200° C., the growth pressure is 5-10⁵ Pa, the plasma current density is 0-50 mA/cm², and the magnetic field intensity in deposition region is 100 G to 30 T.

Deposition of Carbon Nanotubes/Graphene Film:

Firstly, a catalytic layer of nickel, copper, cobalt or a composite catalytic layer thereof is deposited on the surface of the diamond by electroplating, electroless plating, evaporation, magnetron sputtering, chemical vapor deposition or physical vapor deposition. Then, the carbon nanotubes are deposited on the substrate surface, and the deposition parameters are: the mass flow ratio of carbon-containing gas is 5-80%, the growth temperature is 400-1200° C., the growth pressure is 5-10⁵ Pa, the plasma current density is 0-50 mA/cm², the magnetic field intensity in deposition region is 100 G to 30 T. Finally, graphene is deposited on the surface of the carbon nanotubes by chemical vapor deposition; the deposition parameters are: the mass flow ratio of carbon-containing gas is 5-80%, the growth temperature is 400-1200° C., the growth pressure is 5-10⁵ Pa, the plasma current density is 0-50 mA/cm², and the magnetic field intensity in deposition region is 100 G to 30 T.

Deposition of Diamond/Graphene/Carbon Nanotubes Film:

Firstly, the diamond is deposited on the surface of substrate by chemical vapor deposition; the deposition parameters are: the mass flow ratio of carbon-containing gas is 0.5-10%, the growth temperature is 600-1000° C., the growth pressure is 10³-10⁴ Pa. Then, graphene film is deposited on the surface of the diamond, and the deposition parameters are: the mass flow ratio of carbon gas is 5-80%, the growth temperature is 400-1200° C., the growth pressure is 5-10⁵ Pa, the plasma current density is 0-50 mA/cm², the magnetic field intensity in the deposition area is 100 G to 30 T. Finally, a catalytic layer of nickel, copper, cobalt or a composite catalytic layer thereof is deposited on the surface of the diamond by electroplating, electroless plating, evaporation, magnetron sputtering, chemical vapor deposition or physical vapor deposition. The carbon nanotubes forest is deposited on the surface of the graphene; the deposition parameters are: the mass flow ratio of carbon-containing gas is 5-80%, the growth temperature is 400-1200° C., the growth pressure is 5-10⁵ Pa, and the plasma current density is 0-50 mA/cm². Or Firstly, the diamond is deposited on the surface of substrate by chemical vapor deposition; the deposition parameters are: the mass flow ratio of carbon-containing gas is 0.5-10%, the growth temperature is 600-1000° C., and the growth pressure is 10³-10⁴ Pa. Then, a catalytic layer of nickel, copper, cobalt or a composite catalytic layer thereof is deposited on the surface of the diamond by electroplating, electroless plating, evaporation, magnetron sputtering, chemical vapor deposition or physical vapor deposition. A graphene layer is deposited on the surface of diamond; the deposition parameters are: the mass flow ratio of carbon-containing gas is 5-80%, the growth temperature is 400-1200° C., the growth pressure is 5-10⁵ Pa, the plasma current density is 0-50 mA/cm², the magnetic field intensity in the deposition area is 100 G to 30 T. Finally, a carbon nanotubes forest is deposited on graphene by in-situ deposition; the deposition parameters are: the mass flow ratio of carbon-containing gases is 5-80%, the growth temperature is 400-1200° C., the growth pressure is 5-10⁵ Pa, and the plasma current density is 0-50 mA/cm².

Deposition of Diamond/Carbon Nanotubes/Graphene Film:

Firstly, diamond is deposited on the surface of substrate by chemical vapor deposition; the deposition parameters are: the mass flow ratio of carbon gas is 0.5-10%; the growth temperature is 600-1000° C., and the growth pressure is 10³-10⁴ Pa. Then, a catalytic layer of nickel, copper, cobalt or a composite catalytic layer thereof is deposited on the surface of the diamond by electroplating, electroless plating, evaporation, magnetron sputtering, chemical vapor deposition or physical vapor deposition. The carbon nanotubes are deposited on the surface of the diamond; the deposition parameters are: the mass flow ratio of carbon-containing gas is 5-80%; the growth temperature is 400-1200° C.; the growth pressure is 5-10⁵ Pa; the plasma current density is 0-50 mA/cm²; the magnetic field intensity in deposition region is 100 G to 30 T. Finally, graphene is deposited in-situ on the surface of carbon nanotubes by chemical vapor deposition; the deposition parameters are: the mass flow ratio of carbon-containing gas is 5-80%; the growth temperature is 400-1200° C., and the growth pressure is 5-10⁵ Pa; the plasma current density is 0-50 mA/cm2; the magnetic field intensity in the deposition area is 100 G to 30 T.

Step 3: The foamed skeleton deposited with the reinforcing layer is compounded with a matrix material.

The invention relates to a preparation method of a composite material reinforced by a foamed skeleton. The diamond film in the reinforcing layer is boron-doped or nitrogen-doped diamond. The boron-doped or nitrogen-doped diamond deposition parameters are: carbon containing gas mass flow ratio is 0.5-10%; growth temperature is 600-1000° C., growth pressure is 10³-10⁴ Pa. The boron source adopts one of solid, liquid, gaseous boron, and the nitrogen source adopts one of nitrogen and ammonia.

In a preparation method of a composite material reinforced by a foamed skeleton of this invention, the surface of boron-doped or nitrogen-doped diamond is etched by using active hydrogen atoms or plasma or metal catalyzed etching, so that the surface of the reinforcing layer is evenly distributed with micro-pores and/or cones. In the metal catalyzed etching treatment, the metal is selected from one of nickel, copper, gold, silver, cobalt and rhenium. The metal thickness of the thermal catalytic etching is 1 nm-900 nm, the temperature of the thermal catalytic etching is 700-1000° C., and the time is 1-180 minutes.

In a preparation method of a composite material reinforced by a foamed skeleton of this invention, a second-modifying layer is prepared on the surface of the reinforcing layer of the foamed skeleton, using a technology selected from one of pressure infiltration, pressure-free infiltration and vacuum suction casting; wherein the second-modifying layer is selected from at least one of tungsten, tungsten carbide, molybdenum, molybdenum carbide, chromium, chromium carbide, titanium, titanium carbide, nickel, copper, aluminum, platinum, tungsten-based alloy, a molybdenum-based alloy, a chromium-based alloy, a titanium-based alloy, a nickel-based alloy, a copper-based alloy, an aluminum-based alloy and a platinum-based alloy. The second-modifying layer is prepared on the surface of the reinforcing layer by a method selected from one of electroplating, electroless plating, evaporation, magnetron sputtering, chemical vapor deposition and physical vapor deposition.

In a preparation method of a composite material reinforced by a foamed skeleton of this invention, the foamed skeleton deposited with a reinforcing layer is mixed with a polymer, reinforcing particles, a coupling agent, an antioxidant and processing aids. The mixture is heated to a temperature ranged from the melting point to the degradation temperature of the polymer. Through a method selected from one of impregnation and curing, injection molding, pressing, injection molding, rolling molding, extrusion forming, laminating forming and casting forming, the foamed skeleton deposited with the reinforcing layer is compounded with a polymer matrix.

In a preparation method of a composite material reinforced by a foamed skeleton of this invention, the paraffin is heated to the temperature ranged from 100 to 180° C. After fully melted, a supporting material and a flame retardant are added and stirred. After fully dissolved, a phase-change energy-storage liquid matrix solution is obtained. The foamed skeleton deposited with the reinforcing layer is then added into the phase-change energy-storage liquid matrix solution and put into a tubular furnace with a vacuum equipment. The furnace temperature is set at 90-180° C., the vacuum in the furnace is below 10 Pa, and the air is discharged until no obvious bubbles come out. Then, one of air, nitrogen and argon is put into the furnace. After 10-180 minutes of heat insulation, the paraffin composite material reinforced by a foamed skeleton is obtained with the furnace cooling.

In a preparation method of a composite material reinforced by a foamed skeleton of this invention, the composite material is used in the fields of electronic packaging, thermal management devices, phase-change energy-storage, and grinding; or the foamed skeleton with a reinforced layer is directly used in the fields of electronic packaging, sewage treatment and biosensors.

In a preparation method of a composite material reinforced by a foamed skeleton of this invention, after cleaned and dried, the foamed skeleton is compounded with a metal matrix by pressure infiltration technology.

In a preparation method of a composite material reinforced by a foamed skeleton of this invention, after cleaned and dried, the foamed skeleton is deposited with a reinforcing layer selected from a diamond film, a graphene film, or a carbon nanotubes film by chemical vapor deposition, and then, compounded with a metal matrix or a polymer matrix. The deposition parameters are:

CVD Parameters of Diamond:
the mass flow ratio of a carbon-containing gas is 0.5-10%; the growth temperature is 600-1000° C., and the growth pressure is 103-104 Pa;

CVD Parameters of Graphene Film:
the mass flow ratio of carbon-containing gas is 0.5-80%; the growth temperature is 400-1200° C., the growth pressure is 5-$10^5$ Pa; the plasma current density is 0-50 mA/cm$^2$; the magnetic field intensity in deposition region is 100 G to 30 T;

CVD Parameters of Carbon Nanotubes:
the mass flow ratio of carbon-containing gas is 5-50%; the growth temperature is 400-1300° C., and the growth pressure is $10^3$-$10^5$ Pa; the plasma current density is 0-30 mA/cm$^2$; the magnetic field intensity in the deposition area is 100 G to 30 T. Or After cleaned and dried, the surface of the foamed skeletons is deposited with a reinforcing layer by chemical vapor deposition. The reinforcing layer is selected from a diamond/graphene film, a diamond/carbon nanotubes film, a graphene/carbon nanotubes film, a carbon nanotubes/graphene film, a diamond/graphene/carbon nanotubes film, and a diamond/carbon nanotubes/graphene film. Then, the foamed skeletons are compounded with a metal matrix.

In the deposition process, plasma assisted growth is applied on the substrate of the foamed skeleton, and plasma is confined to the near surface of the foamed skeleton by adding magnetic field at the bottom of the substrate. The bombardment of the plasma on the surface of the foamed skeleton is strengthened, and thus the deposition rate is increased and the growth direction of the deposition is controlled. The deposition parameters are:

Diamond/Carbon Nanotubes Film:
Firstly, diamond is deposited on the surface of a substrate by chemical vapor deposition, and the deposition parameters are: the mass flow ratio of carbon-containing gas is 0.5-10.0%; the growth temperature is 600-1000° C., the growth pressure is $10^3$-$10^4$ Pa. Then, the carbon nanotubes are deposited on the surface of the diamond, and the deposition parameters of carbon nanotubes are: the mass flow ratio of carbon-containing gas is 5-50%; the growth temperature is 400-1300° C., the growth pressure is $10^3$-$10^5$ Pa; the plasma current density is 0-30 mA/cm$^2$; and the magnetic field intensity in the deposition area is 100 G to 30 T.

Deposition of Diamond/Graphene Film:
Firstly, diamond is deposited on the surface of a substrate by chemical vapor deposition, and the deposition parameters are: the mass flow ratio of carbon-containing gas is 0.5-10.0%; the growth temperature is 600-1000° C., the growth pressure is $10^3$-$10^4$ Pa. Then, graphene walls are deposited on the surface of the diamond. Graphene grows perpendicular to the surface of the diamond to form graphene walls, and the deposition parameters are: the mass flow ratio of carbon-containing gas is 0.5-80%, the growth temperature is 400-1200° C., the growth pressure is 5-$10^5$ Pa, the plasma current density is 0-50 mA/cm$^2$, and the magnetic field intensity in the deposition region is 100 G to 30 T.

Deposition of Graphene/Carbon Nanotubes Film:
Firstly, the graphene wall is deposited on the surface of a substrate by chemical vapor deposition; and the deposition parameters are: the mass flow ratio of carbon-containing gas is 5-80%; the growth temperature is 400-1200° C., the growth pressure is 5-$10^5$ Pa; the plasma current density is 0-50 mA/cm$^2$; and the magnetic field intensity in the deposition area is 100 G to 30 T. Then, carbon nanotubes are deposited on the surface of the graphene; and the deposition parameters are: the mass flow ratio of carbon-bearing gas is 5-80%; the growth temperature is 400-1200° C.; the growth pressure is 5-105 Pa; the plasma current density is 0-50 mA/cm$^2$; and the magnetic field intensity in the deposition area is 100 G to 30 T.

Deposition of Carbon Nanotubes/Graphene Film:
Firstly, a catalytic layer of nickel, copper, cobalt or a composite catalytic layer thereof is deposited on the surface of the diamond by electroplating, electroless plating, evaporation, magnetron sputtering, chemical vapor deposition or physical vapor deposition. Then, carbon nanotubes are deposited on the surface of the substrate, and the deposition parameters are: the mass flow ratio of carbon-containing gas is 5-80%, the growth temperature is 400-1200° C., the growth pressure is 5-$10^5$ Pa, the plasma current density is 0-50 mA/cm$^2$, the magnetic field intensity in deposition region is 100 G to 30 T. Finally, graphene is deposited in-situ on the surface of the carbon nanotubes by chemical vapor deposition; and the deposition parameters are: the mass flow ratio of carbon-containing gas is 5-80%, the growth temperature is 400-1200° C., the growth pressure is 5-$10^5$ Pa, the plasma current density is 0-50 mA/cm$^2$, and the magnetic field intensity in deposition region is 100 G to 30 T.

Deposition of Diamond/Graphene/Carbon Nanotubes Film:

Firstly, the diamond is deposited on the surface of a substrate by chemical vapor deposition; the deposition parameters are: the mass flow ratio of carbon-containing gas is 0.5-10%, the growth temperature is 600-1000° C., and the growth pressure is $10^3$-$10^4$ Pa. Then, graphene film is deposited on the surface of the diamond, and the deposition parameters are: the mass flow ratio of carbon gas is 5-80%, the growth temperature is 400-1200° C., the growth pressure is 5-$10^5$ Pa, the plasma current density is 0-50 mA/cm$^2$, and the magnetic field intensity in the deposition area is 100 G to 30 T. Finally, the carbon nanotubes forest is deposited on the surface of the graphene; and the deposition parameters are: the mass flow ratio of carbon-containing gas is 5-80%, the growth temperature is 400-1200° C., the growth pressure is 5-$10^5$ Pa, and the plasma current density is 0-50 mA/cm$^2$.

Deposition of Diamond/Carbon Nanotubes/Graphene Film:

Firstly, diamond is deposited on the surface of a substrate by chemical vapor deposition; and the deposition parameters are: the mass flow ratio of carbon gas is 0.5-10%; the growth temperature is 600-1000° C., and the growth pressure is $10^3$-$10^4$ Pa. Then, a catalytic layer of nickel, copper, cobalt or a composite catalytic layer thereof is deposited on the surface of the diamond by electroplating, electroless plating, evaporation, magnetron sputtering, chemical vapor deposition or physical vapor deposition. The carbon nanotubes are deposited on the surface of the diamond; and the deposition parameters are: the mass flow ratio of carbon-containing gas is 5-80%; the growth temperature is 400-1200° C.; the growth pressure is 5-$10^5$ Pa; the plasma current density is 0-50 mA/cm$^2$; and the magnetic field intensity in deposition region is 100 G to 30 T. Finally, graphene is deposited in-situ on the surface of carbon nanotubes by chemical vapor deposition; and the deposition parameters are: the mass flow ratio of carbon-containing gas is 5-80%; the growth temperature is 400-1200° C., and the growth pressure is 5-$10^5$ Pa; the plasma current density is 0-50 mA/cm$^2$; and the magnetic field intensity in the deposition area is 100 G to 30 T.

In a preparation method of a composite material reinforced by a foamed skeleton of this invention, after cleaned and dried, electroplating, electroless plating, evaporation, magnetron sputtering, chemical vapor deposition or physical vapor deposition is used to deposit a metal layer selected from one of Ni, Cu, W, Mo, Ti, Ag, Cr, or a composite metal layer thereof on the surface of a foramed skeleton. Then, the formed skeleton is put in the suspension of nano-crystalline and micro-crystalline diamond particles, the foamed skeleton substrate embedded with numerous nano-crystalline and micro-crystalline diamond particles inside the pores is obtained after ultrasonic oscillation. A reinforcing layer is deposited on the surface of the foamed skeleton or the diamond particles by chemical vapor deposition.

In a preparation method of a composite material reinforced by a foamed skeleton of this invention, after preparing a modifying layer on the surface of the reinforcing layer, the foamed skeleton was compounded with a copper matrix by pressure impregnation. The modifying layer is selected from tungsten, tungsten carbide, molybdenum, molybdenum carbide, chromium, chromium carbide, titanium, titanium carbide, nickel, copper, aluminum, platinum, tungsten alloy, molybdenum alloy, chromium alloy, titanium alloy, nickel alloy, copper alloy, aluminum alloy, platinum alloy. The modifying layer is prepared on the surface of the reinforcement by one of electroplating, chemical plating, evaporation, magnetron sputtering, chemical vapor deposition and physical vapor deposition.

In a preparation method of a composite material reinforced by a foamed skeleton of this invention, before depositing carbon nanotubes, a catalytic layer of nickel, copper, cobalt or a composite catalytic layer thereof is deposited on the surface of the diamond by electroplating, electroless plating, evaporation, magnetron sputtering, chemical vapor deposition or physical vapor deposition.

In this patent, a foamed metal or foamed ceramic or foamed carbon skeleton, which is easy to be prepared and seamless connected, is used as a substrate. The films with highly thermal conductivity (such as diamond, graphene, carbon nanotubes) are deposited on the surface of the substrate by chemical vapor deposition to construct a three-dimensional network of highly thermal conductivity skeleton, which is then compounded with a matrix. The highly thermal conductivity material and matrix form double-connected three-dimensional network interpenetrating structure, so that the reinforcing phase and the matrix phase are continuously distributed in space to form a continuous heat conduction channel and generate parallel heat conduction, thereby weakening the negative effect of the composite interface on the thermal properties of the material. Hence, the reinforcing phase as a whole can fully exert the thermal conductivity without reducing the good plastic toughness of the matrix in the composite. At the same time, in order to achieve further improvement in thermal and mechanical properties, one or more of the highly thermal conductivity diamond powder, graphene, carbon nanotubes, or low thermal expansion coefficient of highly thermal conductivity ceramic particles such as SiC, AlN may be added. By doping the surface of the diamond with boron or nitrogen, a large number of micropores and sharp cones are uniformly distributed, and the specific surface area and mass transfer efficiency are greatly improved. Similarly, using the corresponding high-conductive or high-hard wear-resistant reinforcing layers and reinforcing particles can realize the application of such a foamed skeleton structure reinforced metal matrix or polymer matrix composite material in the fields of electricity and mechanics.

The composites fabricated by this method can completely replicate the structure of the foamed metal. The highly thermal conductivity materials form a fully connected whole by seamless connection and distribute in the composites evenly in the form of three-dimensional network, so the composites possess excellent continuous thermal conduction property, charge conductivity and very low density. And it will be a new type of multifunctional composite materials with great potential for the reason that greatly improved thermal conductivity, electrical conductivity and mechanical strength of the materials compared with traditional composites, which can be widely used in the fields of thermal management, electronics, energy, transportation and other national economic fields.

DESCRIPTION OF EMBODIMENTS

Figure 1:
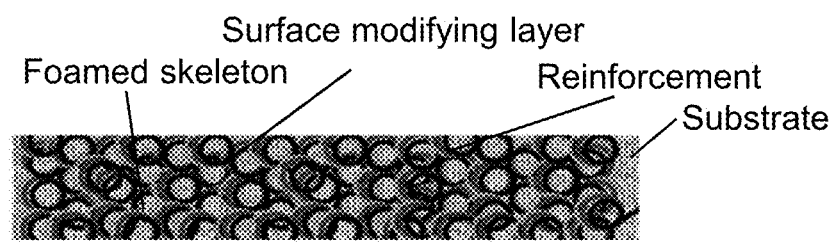
FIG. 1 is a schematic view showing the structure of a foamed skeleton reinforced matrix as a single-body reinforcement in this invention.
Figure 2:
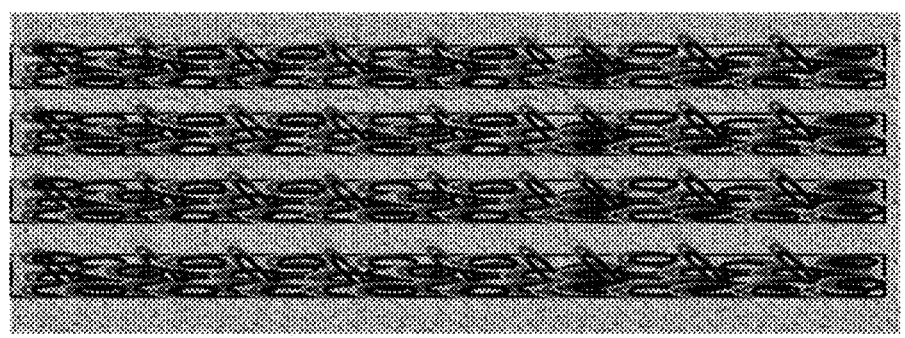
FIG. 2 is a schematic view showing the structure of a foamed skeleton reinforced matrix as a sheet-like reinforcement in parallel arrangement in this invention.
Figure 3:
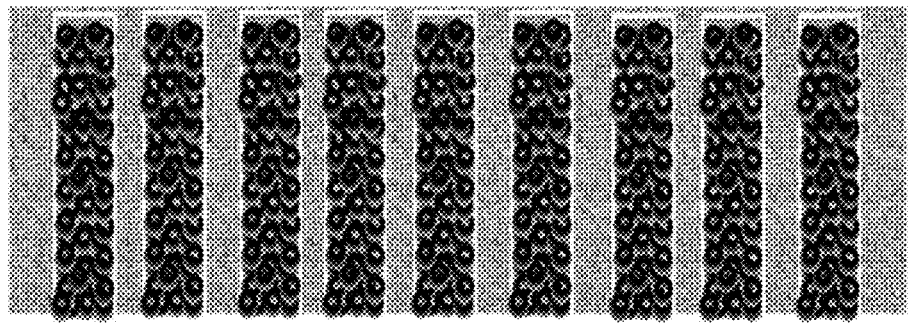
FIG. 3 is a schematic view showing the structure of a foamed skeleton reinforced matrix as a columnar-like reinforcement in parallel arrangement in this invention.
Figure 4:
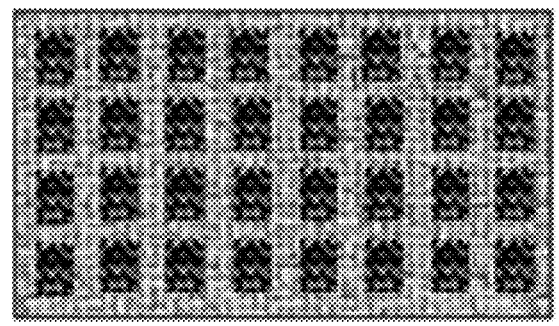
FIG. 4 is a top view of FIG. 3.
Figure 5:
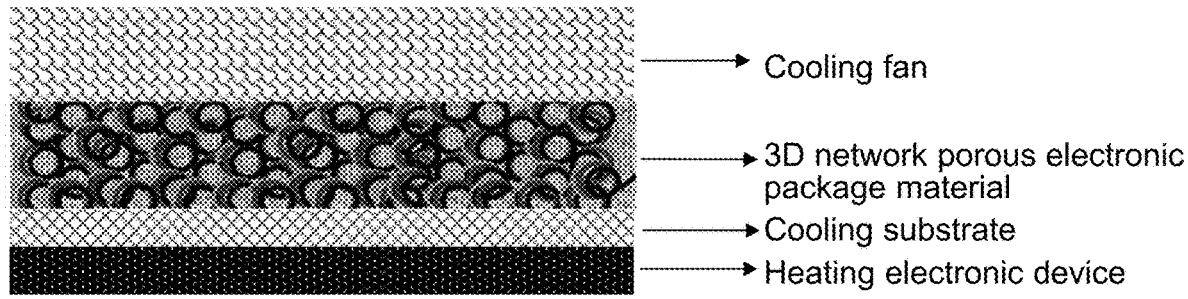
FIG. 5 shows that with gas as a heat dissipating fluid, a three-dimensional network porous electronic packaging material is directly compounded with a fan.
Figure 6:
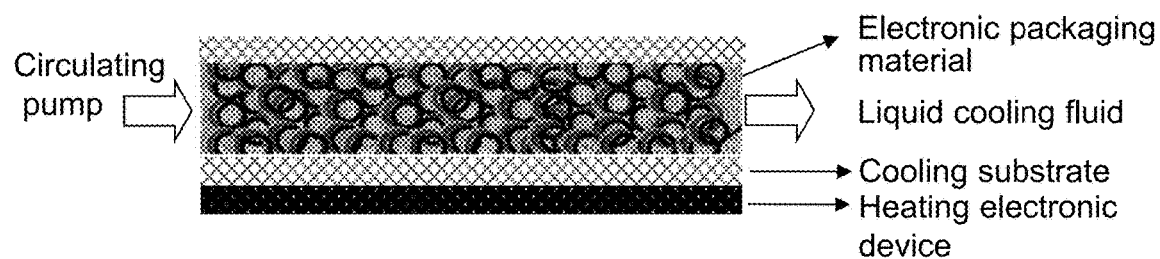
FIG. 6 shows that with liquid as a heat dissipating fluid, a three-dimensional network porous electronic packaging material is directly compounded with a circulation pump.
Figure 7:
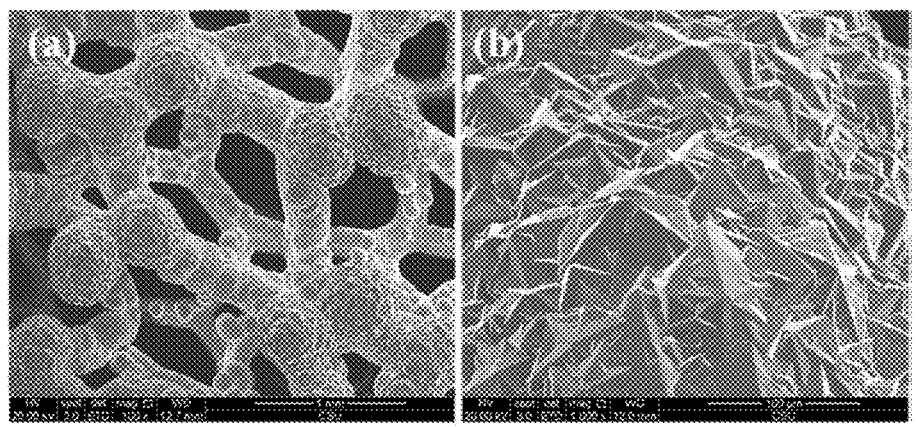
FIG. 7 shows SEM images of surface morphologies of a diamond foam prepared in Example 1, wherein (b) of FIG. 7 is an enlarged view of (a) of FIG. 7.
Figure 8:
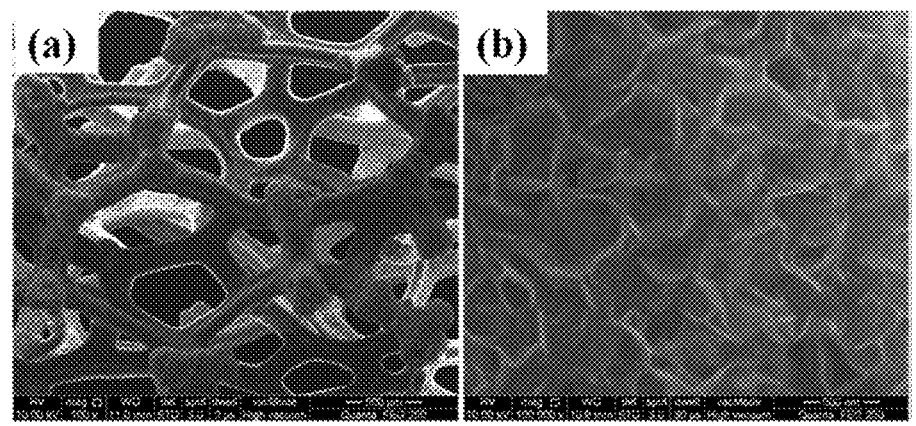
FIG. 8 shows SEM images of surface morphologies of a graphene-coated diamond foam prepared in Example 3, wherein (b) of FIG. 8 is an enlarged view of of FIG. 8.
Figure 9:
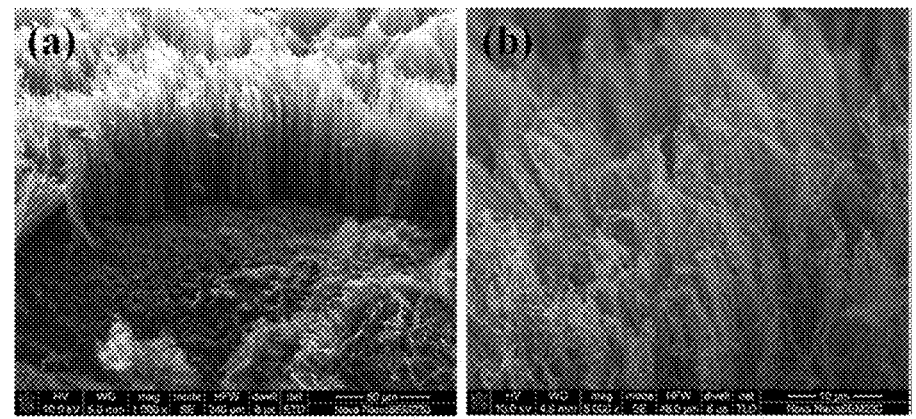
FIG. 9 shows SEM images of surface morphologies of a carbon nanotube-coated diamond foam prepared in Example 4, wherein (b) of FIG. 9 is an enlarged view of (a) of FIG. 9.

The technical proposal of this invention is further described through specific embodiments.

The metal matrix composite material embodiments of this invention are carried out according to the following process or steps:

(1) A foamed skeleton substrate is ultrasonically rinsed in ethanol, then taken out and dried for use.

(2) An intermediate transition layer is prepared on the surface of the foamed skeleton substrate by one method selected from electroplating, electroless plating, evaporation, magnetron sputtering, chemical vapor deposition and physical vapor deposition. The intermediate transition layer comprises one of nickel, copper, tungsten, molybdenum, titanium, silver and chromium or a composite metal layer thereof.

(3) Nanocrystalline and microcrystalline diamond mixed particles, the foamed skeleton substrate, and a solvent are mixed together, heated to boiling, and then under high-power ultrasonic oscillation for 30 min to be uniformly dispersed. Then the foamed skeleton substrate is taken out for drying to obtain a foamed skeleton substrate with a large number of nanocrystalline and microcrystalline diamond particles embedded in the pores thereof.

(4) A continuous dense reinforcing layer is deposited on the metal substrate surface by hot filament chemical vapor deposition (HFCVD). The reinforcing layer is selected from a diamond film, a graphene film, a carbon nanotube film, graphene-coated diamond, carbon nanotube-coated diamond, carbon nanotube-coated graphene, carbon nanotube/graphene composite film-coated diamond.

(5) Before a foamed skeleton with the graphene-reinforcing layer is compounded with a matrix material, in order to improve the bonding performance between the reinforcing layer and the matrix material, surface modification of the reinforcing layer is needed. One or more modifying layers are deposited on the surface of the foamed skeleton with the graphene-reinforcing layer by a method selected from electroplating, electroless plating, evaporation, magnetron sputtering, chemical vapor deposition and physical vapor deposition. The modifying layer is selected from at least one of tungsten, tungsten carbide, molybdenum, molybdenum carbide, chromium, chromium carbide, titanium, titanium carbide, nickel, copper, aluminum, platinum, a tungsten alloy, a molybdenum alloy, a chromium alloy, a titanium alloy, a nickel alloy, a copper alloy, an aluminum alloy and a platinum alloy.

(6) The arrangement of the foamed skeleton reinforcement after surface modification treatment in the matrix can be divided into the following three ways:

a. The formed skeleton is compounded with the matrix as an integral reinforcement, and the composite material forms an interpenetrating structure of diamond/metal matrix network as a whole. b. The foamed skeletonis compounded with the matrix as a sheet-like reinforcement, and the arrangement direction of the reinforcement in the matrix is parallel arrangement.

c. The foamed skeleton is compounded with the matrix as a strip-like reinforcement, and the arrangement direction of the reinforcement in the matrix is parallel arrangement.

(7) The foamed skeleton with the reinforcing layer is compounded with a metal matrix by pressure infiltration technique.

Example 1: Silver-Matrix Composite Reinforced with Foamed Diamond Skeleton

In this example of silver-matrix composite reinforced with a foamed diamond skeleton in this example, a copper foam was used as a substrate having a pore size of 0.2 mm. The volume fraction of the foamed diamond reinforcement in the composite was 20%. Firstly, according to step (1), the three-dimensional network substrate of the copper foam was cleaned. Then, according to step (2), a molybdenum film, as an intermediate transition layer with a thickness of 50 nm, was deposited on the surface of three-dimensional network skeleton of the copper foam by magnetron sputtering technique. Afterwards, according to step (3), the substrate of the foamed skeleton with a large number of nano-crystalline and micro-crystalline diamond particles in pores was obtained. According to step (4), a diamond film was deposited by hot filament CVD, and the deposition parameters were as follows: the filament-to-substrate distance was 6 mm; the substrate temperature was 800° C.; the filament temperature was 2200° C.; the deposition pressure was 3 kPa; the volume flow ratio of $CH_4/H_2$ was 1:99. The thickness of the diamond film was 60 μm by controlling the deposition time. A three-dimensional network skeleton of the diamond-coated copper foam substrate was obtained. After that, according to step (5), before compounding with a matrix material, a tungsten film was in-situ evaporated on the surface of the foamed diamond skeleton by vacuum evaporation method for surface modification; wherein the thickness of the tungsten film was 200 nm. (6) The foamed diamond skeleton coated with tungsten film was placed in a mold, serving as a sheet-like reinforcement to be compounded with the matrix in parallel arrangement. (7) The foamed diamond skeleton was covered with a silver alloy having a volume that was twice the volume of the foamed diamond skeleton. Then, the mold was placed in a heating furnace, at a temperature of about 950° C. for 30 min under a high-purity nitrogen atmosphere. A silver-matrix composite reinforced by the foamed diamond skeleton was obtained, and the thermal conductivity of the composite was 862 W/(m·K).

Example 2: Copper-Matrix Composite Reinforced with Foamed Graphene Skeleton

In this example of copper-matrix composite reinforced with a foamed graphene skeleton, porous ceramic $Al_2O_3$ was used as the substrate having a pore diameter of 2 mm. The volume fraction of the graphene foam reinforcement in composite was 10%. Firstly, the three-dimensional network substrate of $Al_2O_3$ foam was cleaned according to step (1).

Then, according to step (2), a tungsten film, as an intermediate transition layer and with a thickness of 200 nm, was deposited on the surface of the foamed $Al_2O_3$ skeleton by magnetron sputtering technique. Afterwards, according to step (4), graphene was in-situ grown on the substrate surface by plasma enhanced chemical vapor deposition. During the deposition process, plasma was applied to the substrate of the foamed skeleton to assist the graphene growth. The plasma was confined to the near surface of the foamed skeleton by adding a magnetic field at the bottom of the substrate to increase the plasma bombardment to the surface of foamed skeleton and making the graphene growth perpendicular to the surface of substrate. A foamed skeleton with a large amount of thermally conductive graphene-coated diamond particles in pores and a large amount of graphene walls grown on the surface of skeleton was obtained. Deposition parameters were as follows: the substrate temperature was 850° C.; the deposition pressure was 5.0 kPa; the volume flow ratio of $CH_4/H_2$ was 10:90; the plasma current density was 5 $mA/cm^2$; the magnetic field intensity was 500 Gs. Meanwhile, the orientation of the graphene growth was controlled under the applied electric field to make graphene form graphene walls perpendicular to the surface of substrate. A three-dimensional network skeleton of graphene-coated $Al_2O_3$ foam substrate was obtained. After that, before being compounded with a matrix material, a 200 nm thick W—Cu alloy film was sputtered onto the foamed graphene skeleton by magnetron sputtering method for surface modification according to step (5). (6) The foamed graphene skeleton with W—Cu alloy film was set in the mold, serving as a bulk reinforcement to be compounded with the matrix. (7) The thermally conductive foamed graphene skeleton was covered with a Cu—Si alloy having a volume that was twice the volume of the foamed graphene skeleton; wherein the mass fraction of Si was 15%. Next, the mold was placed in a heating furnace, at a temperature of about 1350° C. for 30 min under a high purity nitrogen atmosphere. A copper-matrix composite reinforced by the foamed graphene skeleton was obtained, and the thermal conductivity of the composite was 770 W/(m·K).

Example 3: Copper-Matrix Composite Reinforced with Foamed Diamond/Graphene Skeleton In this example of copper-matrix composite reinforced with a foamed diamond skeleton, a nickel foam with a pore size of 0.2 mm was used as a substrate. The volume fraction of the diamond foam reinforcement in composite was 30%. Firstly, according to step (1), the three-dimensional network substrate of the copper foam was cleaned. Then, according to step (2), a chromium film as an intermediate transition layer with a thickness of 50 nm, was deposited on the surface of the three-dimensional network of the foamed nickel skeleton by vacuum evaporation method. Afterwards, the substrate of the foamed skeleton was seeded with nano-crystalline and micro-crystalline diamond particles according to step (3). According to step (4), a diamond film was deposited by hot filament CVD, and deposition parameters were as follows: the filament-to-substrate distance was 6.0 mm; the substrate temperature was 850° C.; the filament temperature was 2200° C.; the deposition pressure was 3 kPa; the volume flow ratio of $CH_4/H_2$ was 1:99. The thickness of the as-deposited diamond film was kept at 300 μm by tuning the deposition time. Hence, a three-dimensional network skeleton of the diamond coated copper foam substrate was obtained. Next, a graphene layer was in-situ grown on the diamond surface by plasma-assisted chemical vapor deposition technique. During the deposition process, plasma was applied to the substrate of the foamed skeleton to assist the graphene growth. The plasma was confined to the near surface of the diamond foam by adding a magnetic field at the bottom of the substrate, reinforcing the plasma bombardment on the surface of the foamed skeleton and making the graphene grow perpendicular to the surface of substrate. A foamed skeleton with a large amount of thermally conductive graphene-coated diamond particles in pores and a large amount graphene walls grown on the skeleton surface was obtained. Deposition parameters were as follows: the substrate temperature was 900° C.; the deposition pressure was 5.0 kPa; the volume flow ratio of $CH_4/H_2$ was 15:85; the plasma current density was 5 $mA/cm^2$; the magnetic field intensity was 500 Gs. Meanwhile, the orientation of the graphene growth was controlled under the applied electric field to make graphene form graphene walls perpendicular to the surface of the substrate. The reinforcing layer of the graphene-coated diamond film was obtained, and a three-dimensional network skeleton of graphene-coated diamond on the nickel foam substrate was obtained. After that, according to step (5), before compounding with the matrix material, a chromium film was sputtered onto the foamed graphene skeleton by plating method for surface modification; wherein the thickness of the chromium film was 200 nm. (6) The foamed graphene skeleton coated with the chromium film was set in the mold, serving as a strip-like reinforcement to be compounded in the matrix in parallel arrangement. (7) The foamed skeleton with the graphene reinforcing layer was compounded with a copper matrix by vacuum gas pressure casting method. Deposition parameters were as follows: the preform of the foamed graphene skeleton was heated to 1020° C. for 1 h; the mold was heated to 840° C. for 1 h; a copper alloy (Brand T1) was melted at 1160° C. for 0.5 h to remove gas and slag. The copper alloy liquid was poured into the mold until the punch exceeded the sprue gate. After that, the mold was degassed by a die-casting vacuum machine. When the vacuum of the mold was less than 1000 Pa, the punch continued to pressurize, and the final casting pressure was 80 MPa. After holding the pressure for 2 min, the composite was removed from the mold. A copper alloy composite reinforced with the foamed graphene skeleton was obtained. The result of performance test: the overall thermal conductivity of the composite was 954 W/(m·K).

Example 4: Aluminum Alloy Composite Reinforced with Foamed Diamond/Carbon Nanotube Skeleton In this example of aluminum alloy composite reinforced with foamed diamond/carbon nanotube skeleton, a tungsten foam with a pore diameter of 1 mm was used as the substrate. The volume fraction of the diamond foam reinforcement in composite was 40%. Firstly, according to step (1), the three-dimensional network substrate of the tungsten foam was cleaned. A graphene film was in-situ deposited directly on the surface of the diamond foam without an intermediate transition layer by CVD. Afterwards, the substrate of the foamed skeleton was seeded with nano-crystalline and micro-crystalline diamond particles according to step (3). According to step (4), a diamond film was deposited by hot filament CVD and process parameters were as follows: the filament-to-substrate distance was 6.0 mm; the substrate temperature was 900° C.; the filament temperature was 2200° C.; the deposition pressure was 3.0 kPa; the volume flow ratio of $CH_4/H_2$ was 1:99. The thickness of the as-deposited diamond film was kept at 300 μm by tuning the deposition time. A three-dimensional network skeleton of diamond coated tungsten foam substrate was then obtained. A layer of nickel was sputtered on the surface of the diamond by magnetron sputtering, and then carbon nanotubes were then catalytically grown on the surface of the diamond by plasma-assisted chemical vapor deposition. Meanwhile, the orientation of the graphene growth was controlled under the applied electric field to make carbon nanotube form carbon nanotube forests perpendicular to the surface of substrate. The reinforcing layer of carbon nanotubes coated foamed substrate was thus obtained. Process parameter were as follows: the mass flow ratio of $CH_4/H_2$ was 25:75; the growth temperature was 600° C.; the growth pressure was 3000 Pa; the plasma current density was 5 $mA/cm^2$; the magnetic field intensity in the deposition area was 350 Gs. A three-dimensional network skeleton of carbon nanotubes coated diamond on tungsten foam was obtained after 40 min deposition. Then, according to step (5), before the compounding process, a copper layer was plated on the surface of foamed diamond skeleton with perpendicular carbon nanotubes by electroplating method; wherein the thickness of the copper layer was 500 nm. (6) The foamed diamond skeleton plated with copper layer was set in the mold, serving as a bulk reinforcement to be compounded with the matrix; (7) The foamed skeleton with diamond/carbon nanotubes reinforcing layer was compounded with aluminum matrix by vacuum pressure casting method, and process parameters were as follows: the vacuum chamber pressure was 5 Pa; the network skeleton and the molding die were heated to 720° C. for 2 h; the aluminum alloy (grade 6063) which was melted at 760° C. for 1 h; the infiltration pressure was 8 MPa. The pressure was kept until the temperature was cooled to 400° C., and the composite was removed from the mold. An aluminum-matrix composite reinforced by the skeleton of diamond/carbon nanotube coated on tungsten foam substrate was obtained. The result of performance test: the overall thermal conductivity of the composite was 976 W/(m·K).

Example 5: Magnesium Alloy Composite Reinforced with Foamed Graphene/Carbon Nanotube Skeleton In this example of magnesium-matrix composite reinforced with a foamed graphene skeleton, tungsten foam with pore size of 1 mm was used as a substrate. The volume fraction of graphene foam reinforcement in composite was 30%. Firstly, according to step (1), the three-dimensional network substrate of tungsten foam was cleaned. Next, graphene film was in-situ deposited directly on the surface of the diamond foam without an intermediate transition layer by chemical vapor deposition. Then, according to the step (4), a graphene film was deposited by hot wall CVD. Process parameters were as follows: the sample was heated to 950° C. (heating rate: 33° C./min) in an atmosphere of $H_2$ and Ar (flow rate: 200 mL/min and 500 mL/min); after the furnace temperature was raised to 950° C., the heat treatment was carried out for 10 min; after the heat treatment was over, a mixture of $CH_4$, $H_2$ and Ar was introduced (flow rate were respectively 5 mL/min, 200 mL/min and 500 mL/min), and the graphene was grown; cooling rate was 100° C./min. The average thickness of graphene film was 1.7 nm. A three-dimensional network skeleton of graphene on tungsten foam substrate was thus obtained. Next, a layer of nickel was sputtered on the surface of the graphene through magnetron sputtering. Then, the carbon nanotubes were catalytically grown on the surface of the graphene by plasma-assisted chemical vapor deposition. Meanwhile, the orientation of the carbon nanotube growth was controlled under the applied electric field to make carbon nanotube form carbon nanotube forests perpendicular to the substrate surface. The reinforcing layer of carbon nanotubes coated graphene film was thus obtained, and process parameter were as follows: the mass flow ratio of $CH_4/H_2$ was 10%; the growth temperature was 600° C.; the growth pressure was 3000 Pa; the plasma current density was 5 $mA/cm^2$; the magnetic field intensity in the deposition area was 500 Gs; the growth time was 30 min. A three-dimensional network skeleton of carbon nanotubes coated graphene on tungsten foam substrate was then obtained. Then, according to step (5), before the compounding process, a titanium layer was evaporated onto the surface of foamed skeleton by vacuum evaporation method for surface modification; wherein the thickness of the layer was 500 nm. (6) The carbon nanotubes-coated foamed graphene skeleton plated by titanium was placed in a mold, serving as a bulk reinforcement to be compounded with a matrix. (7) The foamed skeleton with graphene reinforcing layer was compounded with a magnesium alloy matrix by vacuum pressure casting method, and process parameters were as follows: the vacuum chamber pressure was 5 Pa; the network skeleton and the mold were heated at 700° C. for 2 h; the magnesium alloy was melted at 750° C. for 1 h; the infiltration pressure was 8 MPa. The pressure was kept until the temperature was cooled to 400° C., and the composite was removed from the mold. A magnesium-matrix composite reinforced by the skeleton of carbon nanotube coated on graphene foam was thus obtained. The result of performance test: the overall thermal conductivity of the composite was 540 W/(m·K).

Example 6: Silver-Matrix Composite Reinforced with Foamed Diamond/Graphene/Carbon Nanotube Skeleton In this example of silver-matrix composite reinforced with a foamed diamond/graphene/carbon nanotube skeleton, a copper foam with a pore diameter of 0.3 mm was used as the substrate. The volume fraction of the diamond foam reinforcement in composite was 10%. Firstly, according to step (1), the three-dimensional network substrate of a copper foam was cleaned. Then, according to step (2), a molybdenum film, as an intermediate transition layer and with a thickness of 50 nm, was deposited on the surface of the three-dimensional network foamed copper skeleton by magnetron sputtering technique. Next, according to step (3), the substrate of the foamed skeleton was seeded with nano-crystalline and micro-crystalline diamond particles. In Step (4), a diamond film was deposited by hot filament CVD, and process parameter were as follows: the filament-to-substrate distance was 6 mm; the substrate temperature was 850° C.; the filament temperature was 2200° C.; the deposition pressure was 3 kPa; the volume flow ratio of $CH_4/H_2$ was 1:99. The thickness of the deposited diamond film can be controlled at 60 μm by tuning the CVD deposition time. A three-dimensional network skeleton of a diamond coated copper foam substrate was obtained. Then, a graphene film was deposited by hot wall CVD, and process parameters were as follows: the sample was heated to 950° C. (heating rate: 33° C./min) in an atmosphere of $H_2$ and Ar (flow rate: 200 mL/min and 500 mL/min), and was heat treated for 10 min at 950° C.; after the heat treatment was over, a mixture of $CH_4$, $H_2$ and Ar was introduced (flow rate were respectively 5 mL/min, 200 mL/min and 500 mL/min), and the graphene was grown; cooling rate was 100° C./min; the growth time was 50 min. A three-dimensional network skeleton of diamond/graphene on copper foam substrate was obtained. Next, a layer of nickel was sputtered on the surface of the graphene through magnetron sputtering. Then, carbon nanotubes were catalytically grown on the surface of the graphene by plasma-assisted chemical vapor deposition. Meanwhile, the orientation of the carbon nanotubes growth was controlled by an applied electric field, leading to carbon nanotube form carbon nanotube forests perpendicular to the surface of graphene. A three-dimensional network skeleton of diamond/grapheme/carbon nanotube-coated copper foam substrate was thus obtained, and process parameters were as follows: the mass flow ratio of $CH_4/H_2$ was 10%; the growth temperature was 600° C.; the growth pressure was 3000 Pa; the plasma current density was 5 $mA/cm^2$; the magnetic field intensity in the deposition area was 30 Gs; the growth time was 60 min. Then, according to step (5), before the compounding process, a tungsten layer was evaporated onto the surface of foamed diamond skeleton by vacuum evaporation method for surface modification; wherein the thickness of the layer was 150 nm. (6) The foamed diamond skeleton coated with a tungsten layer was placed in the mold, serving as a sheet-like reinforcement to be compounded with the matrix in parallel arrangement. (7) The foamed skeleton was covered with the silver alloy that was 2 times in the volume. Then, the mold was placed in a heating furnace, at a temperature of about 950° C. for 30 min under a high-purity nitrogen atmosphere. A silver-matrix composite reinforced with foamed diamond/graphene/carbon nanotube skeleton was obtained and the thermal conductivity of the composite was 697 W/(m·K).

Example 7: Titanium-Matrix Composite Reinforced with Foamed Graphene Skeleton

In this example of titanium-matrix composite reinforced with a foamed graphene skeleton, porous ceramic SiC was used as a substrate having a pore diameter of 2 mm. The volume fraction of the foamed graphene reinforcement in composite was 15%. Firstly, the three-dimensional network substrate of a SiC foam was cleaned according to step (1). Then, according to step (2), a tungsten film, as an intermediate transition layer and with a thickness of 200 nm, was deposited on the surface of foamed SiC skeleton by magnetron sputtering technique. Afterwards, graphene was in-situ grown on the surface of substrate by plasma enhanced chemical vapor deposition. During the deposition process, plasma was applied to the substrate of the foamed skeleton to assist the graphene growth according to step (4). The plasma was confined to the near surface of the diamond foam by adding a magnetic field at the bottom of the substrate, reinforcing the plasma bombardment to the surface of the foamed skeleton and making the graphene growth perpendicular to the surface of the substrate. A skeleton with a large amount of highly thermal conductive particles of graphene-coated diamond in the pores thereof and graphene walls grown on the surface thereof was thus obtained. The deposition parameters were as follows: the substrate temperature was 850° C.; the deposition pressure was 5.0 kPa; the volume flow ratio of CH4/H2 was 10:90; the plasma current density was 5 mA/cm2; the magnetic field intensity was 500 Gs. Meanwhile, the orientation of the graphene growth was controlled under the applied electric field to make graphene form graphene walls perpendicular to the surface of the substrate. A foamed graphene skeleton was then obtained. After that, before being compounded with the matrix material, W—Cu alloy film was sputtered onto the foamed graphene skeleton by magnetron sputtering method for surface modification according to step (5); wherein the thickness of W—Cu alloy film was 200 nm. (6) The foamed graphene skeleton coated with W—Cu alloy film was set in the mold, serving as a bulk reinforcement to be compounded with the matrix. (7) The highly thermal conductive foamed graphene skeleton was covered with the titanium alloy having a volume that was twice the volume of the foamed graphene skeleton. Then, the mold was placed in a heating furnace, at a temperature of about 1750° C. for 30 min under a high-purity nitrogen atmosphere. A titanium-matrix composite reinforced with the foamed graphene skeleton was obtained. The thermal conductivity of the composite was 728 W/(m·K).

Example 8: Magnesium-Matrix Composite Reinforced with Foamed Diamond Skeleton

In this example of magnesium-matrix composite reinforced with a foamed diamond skeleton, a carbon foam was used as a substrate having a pore diameter of 0.35 mm. The volume fraction of the foamed diamond reinforcement in composite was 30%. Firstly, the three-dimensional network substrate of carbon foam was cleaned according to step (1). Then, according to step (2), a molybdenum film, as an intermediate transition layer and with a thickness of 50 nm, was deposited on the surface of three-dimensional network-like foamed carbon skeleton by magnetron sputtering technique. Afterwards, the substrate of foamed skeleton was seeded with nano-crystalline and micro-crystalline diamond particles according to step (3). According to step (4), a diamond film was deposited by hot filament CVD. Deposition process parameters were as follows: the filament-to-substrate distance was 6 mm; the substrate temperature was 800° C.; the deposition pressure was 3 kPa; the volume flow ratio of $CH_4/H_2$ was 1:99. The thickness of the as-deposited diamond film was kept at 300 μm by tuning the deposition time. A three-dimensional network skeleton of diamond coated carbon foam substrate was obtained. After that, before being compounded with a matrix material, a tungsten film was in-situ evaporated on the surface of the foamed diamond skeleton by vacuum evaporation method for surface modification according to step (5); wherein the thickness of tungsten film was 100 nm. (6) The foamed diamond skeleton coated with the tungsten film was placed in the mold, serving as a sheet-like reinforcement to be compounded with a matrix in parallel arrangement. (7) Foamed diamond skeleton was compounded with magnesium matrix by vacuum gas pressure casting method. Process parameters were as follows: the pressure in vacuum chamber was 5 Pa; the heating temperature of the foamed skeleton and the mold was 700° C. for 2 h; the heating temperature of the magnesium alloy was 750° C. for 1 h; the infiltration pressure was 8 MPa. The pressure was kept until the temperature was cooled to 400° C., and the composite was removed from the mold. A magnesium-matrix composite reinforced by the skeleton of diamond coated carbon foam substrate was obtained. The result of performance test: the overall thermal conductivity of the composite was 875 W/(m·K).

Example 9: Aluminum-Matrix Composite Reinforced with Foamed Boron-Doped Diamond Skeleton In this example of aluminum-matrix composite reinforced with a foamed boron-doped diamond skeleton, a copper foam was used as a substrate having a pore diameter of 0.3 mm. The volume fraction of the foamed diamond reinforcement in composite was 20%. Firstly, the three-dimensional network substrate of the copper foam was cleaned according to step (1). Then, according to step (2), a chromium film, as an intermediate transition layer and with a thickness of 50 nm, was deposited on the surface of three-dimensional network-like foamed copper skeleton by magnetron sputtering technique. Afterwards, the substrate of the foamed skeleton was seeded with nano-crystalline and micro-crystalline diamond particles according to step (3). According to step (4), a diamond film was deposited by hot filament CVD. Deposition process parameters were as follows: the filament-to-substrate distance was 6 mm; the substrate temperature was 800° C.; the filament temperature was 2200° C.; the deposition pressure was 3 kPa; the source of boron was $B_2H_6$, and the volume flow ratio of $B_2H_6/CH_4/H_2$ was 0.2:1:99. The thickness of the as-deposited boron-doped diamond film was kept at 60 μm by tuning the deposition time. A three-dimensional network skeleton of a diamond coated copper foam substrate was obtained. After that, before being compounded with a matrix material, a nickel film was sputtered onto the foamed diamond skeleton by magnetron sputtering method for surface modification according to step (5); wherein the thickness of nickel film was 10 nm. (6) The as-prepared sample in the step (5) was put into a tube furnace with a vacuum device for catalysis. The catalytic temperature was set to 900° C.; the atmosphere for catalytic etching was nitrogen; the pressure of catalytic etching was 1 atm; the catalytic etching time was 3 h. A foamed boron-doped diamond skeleton with pores and sharp cones on the surface was obtained. (7) The as-prepared foamed boron-doped diamond skeleton was placed in the mold, serving as a sheet-like reinforcement to be compounded with a matrix in parallel arrangement. (8) The foamed boron-doped diamond skeleton was compounded with pure aluminum matrix by vacuum pressure infiltration method. Process parameters were as follows: the pressure in vacuum chamber was 5 Pa; the heating temperature of the foamed skeleton and the mold was 700° C. for 2 h; the heating temperature of the pure aluminum was 720° C. for 0.5 h; the infiltration pressure was set to 8 MPa. The pressure was kept until the temperature was cooled to 400° C., and the composite was removed from the mold. An aluminum-matrix composite reinforced with the foamed boron-doped diamond skeleton was obtained. The result of performance test: the overall thermal conductivity of the composite was 676 W/(m·K).

In this invention, the embodiments of polymer matrix composites is according to the process or steps as follows:

(1) A foamed skeleton is placed in ethanol for ultrasonic cleaning, and dried for use.

(2) An intermediate transition layer is deposited on the surface of the foamed skeleton through a method selected from one of electroplating, electroless plating, evaporation, magnetron sputtering, chemical vapor deposition and physical vapor deposition; wherein the intermediate transition layer is selected from one of nickel, copper, tungsten, molybdenum, titanium, silver, chromium, or a composite metal layer thereof.

(3) The mixture of nano-crystalline and micro-crystalline diamond particles, the foamed skeleton substrate, and the solvent are mixed and heated to boil. Then, the mixture is under high-power ultrasonic oscillation for 30 minutes. After ultrasonic dispersion uniformly, the foamed skeleton is taken out and dried. The substrate of the foamed skeleton with a large amount of nano-crystalline and micro-crystalline diamond particles in pores was obtained.

(4) A continuous and dense reinforcing layer is deposited on the metal substrates by hot filament chemical vapor deposition; wherein the reinforcing layer is selected from at least one of diamond film, graphene film, carbon nanotube film, graphene coated diamond, carbon nanotube coated diamond, carbon nanotube coated graphene and carbon nanotube/graphene coated diamond.

(5) The distribution of foamed skeleton reinforcement in a matrix after surface modification can be according to the following three arrangements. a. The foamed skeleton serves as a bulk reinforcement to be compounded with a matrix. The whole composite presents an interpenetrated network configuration of highly thermal conductivity reinforcing layer/polymer. b. The foamed skeleton serves as a sheet-like reinforcement to be compounded with a matrix. The distribution of reinforcement in the matrix is in parallel arrangement. c. The foamed skeleton serves as a strip-like reinforcement to be compounded with a matrix. The distribution of reinforcement in the matrix is in parallel arrangement.

(6) The impregnation and curing techniques are carried out to integrate the foamed skeleton with the reinforcing layer into polymer matrix.

Example 10: (Diamond)

In this example of epoxy-matrix composite reinforced with a foamed diamond skeleton, a copper foam was used as a substrate having a pore diameter of 0.2 mm. The volume fraction of the foamed diamond reinforcement in the composite was 20%. Firstly, a three-dimensional network substrate of a copper foam was cleaned according to step (1). Then, according to step (2), a molybdenum film, as an intermediate transition layer and with a thickness of 50 nm, was deposited on the surface of the three-dimensional network-like foamed copper skeleton by magnetron sputtering technique. Afterwards, the substrate of the foamed skeleton was seeded with nano-crystalline and micro-crystalline diamond particles according to step (3). According to step (4), a diamond film was deposited by hot filament CVD. Deposition process parameters were as follows: the filament-to-substrate distance was 6 mm; the substrate temperature was 800° C.; the deposition pressure was 3 kPa; the volume flow ratio of $CH_4/H_2$ was 1:99. The thickness of the as-deposited diamond film was kept at 160 μm by tuning the deposition time. A three-dimensional network skeleton of diamond coated copper foam substrate was hence obtained. (5) The foamed diamond skeleton was set in the mold, serving as a sheet-like reinforcement to be compounded with the matrix in parallel arrangement. (6) A precursor solution of Bisphenol F epoxy (the curing agent was diaminodiphenyl methane (DDM)) was dripped into the foamed diamond skeleton at volume ratio of 1:1 at 80° C. The foamed diamond skeleton was fully infiltrated by the precursor solution of the epoxy resin, and a mixture was obtained. The above mixture was degassed under vacuum for 2 h to remove the bubbles inside, making the precursor solution of the epoxy better impregnate to the pores of the diamond network. The mixture was step cured at 100° C. for 2 h and then at 160° C. for 4 h. Finally, after being cooled to room temperature, a bisphenol F epoxy resin composite reinforced with the foamed diamond skeleton was obtained. The thermal conductivity of the composite was 349 W/(m·K).

Example 11: (Graphene Wall)

In this example of silicone rubber composite reinforced with a foamed graphene skeleton, a porous ceramic $Al_2O_3$ was used as a substrate having a pore diameter of 2 mm. The volume fraction of the foamed graphene reinforcement in composite was 10%. Firstly, the three-dimensional network substrate of the $Al_2O_3$ foam was cleaned according to step (1). Then, according to step (4), graphene was in-situ grown on the surface of substrate by plasma enhanced chemical vapor deposition. During the deposition process, plasma was applied to the substrate of foamed skeleton to assist the graphene growth. The plasma was confined to the near surface of the diamond foam by adding a magnetic field at the bottom of the substrate, reinforcing the plasma bombardment to the surface of foamed skeleton and making the graphene growth perpendicular to the surface of substrate. A foamed skeleton with a large amount of highly thermal conductive graphene-coated diamond particles in pores and a large amount graphene walls grown on the skeleton surface was obtained. Deposition parameters were as follows: the substrate temperature was 800° C.; the deposition pressure was 5.0 kPa; the volume flow ratio of $CH_4/H_2$ was 30:70; the plasma current density was 5 $mA/cm^2$; the magnetic field intensity was 500 Gs; the deposition time was 1 h. Meanwhile, the orientation of the graphene growth was controlled under the applied electric field to make graphene form graphene walls perpendicular to the surface of substrate. A three-dimensional network skeleton of graphene coated on the $Al_2O_3$ foam substrate was obtained. After that, before being compounded with a matrix material, W—Cu alloy film was sputtered onto the foamed graphene skeleton by magnetron sputtering method for surface modification according to step (5); wherein the thickness of W—Cu alloy film was 200 nm. (6) The foamed graphene skeleton coated with W—Cu alloy film was set in the mold, serving as a bulk reinforcement to be compounded with the matrix. (7) A precursor solution of silicone rubber was dripped into the foamed graphene skeleton at a volume ratio of 1:2. The foamed graphene skeleton was fully infiltrated by the precursor solution of the silicone rubber, and a mixture was obtained. The above mixture was degassed under vacuum for 2 h to remove the solvent and bubbles inside, making the precursor solution of silicone rubber to be better impregnated into the pores of the graphene network. The mixture was cured at 80° C. for 4 h. A silicone rubber composite reinforced with a foamed graphene skeleton was obtained. The thermal conductivity of the composite was 278 W/(m·K).

Example 12: (Graphene Coated Diamond)

In this example of polymethyl methacrylate (PMMA) composite reinforced with a foamed diamond skeleton, a nickel foam was used as a substrate having a pore diameter of 0.3 mm. The volume fraction of the foamed diamond reinforcement in composite was 30%. Firstly, the three-dimensional network substrate of the nickel foam was cleaned according to step (1). Then, according to step (2), a chromium film, as an intermediate transition layer and with a thickness of 300 nm, was deposited on the surface of three-dimensional network-like foamed nickel skeleton by evaporation method. Afterwards, according to step (3), the substrate of foamed skeleton was seeded with nano-crystalline and micro-crystalline diamond particles. (4) Diamond film was deposited by hot filament CVD. Deposition process parameters were as follows: the filament-to-substrate distance was 6 mm; the substrate temperature was 850° C.; the filament temperature was 2200° C.; the deposition pressure was 3 kPa; the volume flow ratio of $CH_4/H_2$ was 1:99. The thickness of the as-deposited diamond film was kept at 280 µm. A three-dimensional network skeleton of diamond coated nickel foam substrate was thus obtained. Next, graphene was in-situ grown on the diamond surface by plasma enhanced chemical vapor deposition. During the deposition process, plasma was applied to the substrate of the foamed skeleton to assist the graphene growth. The plasma was confined to the near surface of the diamond foam by adding a magnetic field at the bottom of the substrate to increase the plasma bombardment to the surface of the foamed skeleton and making the graphene growth perpendicular to the surface of substrate. A foamed skeleton with a large amount of highly thermal conductive graphene-coated diamond particles in pores and a large amount graphene walls grown on the skeleton surface was obtained. Deposition parameters were as follows: the substrate temperature was 800° C.; the deposition pressure was 5.0 kPa; the volume flow ratio of $CH_4/H_2$ was 25:75; the plasma current density was 15 $mA/cm^2$; the magnetic field intensity was 500 Gs; the deposition time was 30 min. Meanwhile, the orientation of the graphene growth was controlled under the applied electric field to make graphene form graphene wall perpendicular to the surface of substrate. A reinforcing layer of graphene coated diamond film was obtained, and a three-dimensional network skeleton of graphene coated diamond on the nickel foam substrate was obtained. According to step (6), the foamed graphene skeleton was placed in the mold, serving as a strip-like reinforcement to be compounded with a matrix in parallel arrangement. (7) A PMMA chloroform solution was dripped into the foamed graphene skeleton at volume ratio of 1:5. The foamed diamond skeleton was fully infiltrated by the PMMA solution, and a mixture was obtained. The above mixture was dried under vacuum oven at 60° C. for 24 h to remove the chloroform solvent. The mixture was cured at 110° C. for 1 h. Finally, after being cooled to room temperature, a PMMA composite reinforced with foamed skeleton of graphene-coated diamond was obtained. The thermal conductivity of the composite was 408 W/(m·K).

Example 13: Diamond/Carbon Nanotube

In this example of epoxy resin composite reinforced with foamed diamond/carbon nanotube skeleton, a tungsten foam was used as a substrate having a pore diameter of 1 mm. The volume fraction of the foamed diamond reinforcement in composite was 50%. Firstly, the three-dimensional network substrate of the tungsten foam was cleaned according to step (1). Afterwards, the substrate of foamed skeleton was seeded with nano-crystalline and micro-crystalline diamond particles according to step (3). According to step (4), a diamond film was deposited by hot filament CVD. The deposition parameters were as follows: filament-to-substrate distance was 6 mm; substrate temperature was 900° C.; filament temperature was 2300° C.; deposition pressure was 3 kPa; the volume flow ratio of $CH_4/H_2$ was 1:99. The thickness of the as-deposited diamond film was 500 µm, and a three-dimensional network skeleton of diamond on the tungsten foam substrate was obtained. Then, a nickel layer was sputtered onto the surface of the diamond through magnetron sputtering, and carbon nanotubes were then catalytically grown on the surface of the nickel by plasma-assisted chemical vapor deposition technique. Meanwhile, the orientation of the carbon nanotube growth was controlled under the applied electric field to make graphene form carbon nanotube forest perpendicular to the surface of substrate. The reinforcing layer of the carbon nanotube coated diamond film was obtained. The deposition parameters were as follows: the ratio of mass flow rate of methane and hydrogen was 25:75; the growth temperature was 600° C.; the growth pressure was 3 kPa; plasma current density was 5 mA/cm$^2$; the magnetic field intensity was 350 Gs. A three-dimensional network foamed skeleton of carbon nanotube coated diamond on tungsten foam substrate was obtained. According to step (5), the foamed carbon nanotube/diamond skeleton was placed in a mold, serving as a bulk reinforcement to be compounded with a matrix. (6) A precursor solution of Bisphenol F epoxy resin (the curing agent was Diaminodiphenylmethane (DDM)) was dripped into the foamed diamond skeleton at volume ratio of 1:1. The foamed diamond skeleton was fully infiltrated by the precursor solution of the epoxy resin, and a mixture was obtained. Then the above mixture was degassed under vacuum for 2 h to remove the bubbles and make the precursor solution to be better impregnated into the pores of the diamond network. The mixture was step heated and cured at 100° C. for 2 h, and then raised to 160° C. for 4 h. After being cooled to room temperature, a bisphenol F epoxy resin composite reinforced with the foamed diamond/carbon nanotube skeleton was obtained, and the thermal conductivity of the composite was 536 W/(m·K).

Example 14: Graphene/Carbon Nanotube

In this example of silicone rubber composite reinforced with a foamed graphene/carbon nanotube skeleton, a nickel-iron foam was used as a substrate having a pore diameter of 1 mm. The volume fraction of the foamed graphene reinforcement was 7%. Firstly, the three-dimensional network of nickel-iron foam substrate was cleaned according to step (1). Then, the graphene film was in-situ grown through CVD directly without an intermediate transition layer. Afterwards, the graphene film was deposited by hot wall CVD accordingly, and specifically: the sample was heated to 950° C. in an atmosphere of $H_2$ and Ar (the flow rate of $H_2$ and Ar was 200 mL/min and 500 mL/min respectively; the heating rate was 33° C./min), and was heat treated for 10 min after the furnace temperature was raised to 950° C. After the heat treatment, the mixture gas of $CH_4$, $H_2$ and Ar was introduced (flow rate: $CH_4$ was 5 mL/min, $H_2$ was 200 mL/min and Ar was 500 mL/min respectively), and the graphene was grown. The cooling rate was 100° C./min and deposition time was 2 h. A three-dimensional network skeleton of graphene on the nickel-iron substrate was obtained. Next, a layer of nickel was sputtered onto the surface of the graphene through magnetron sputtering technique. Then carbon nanotubes were catalytically grown on the surface of the graphene by plasma-assisted chemical vapor deposition technique. Meanwhile, the orientation of the carbon nanotube growth was controlled under the applied electric field to make graphene form carbon nanotube forests perpendicular to the surface of the graphene. The reinforcing layer of carbon nanotube coated graphene film was obtained, and the deposition parameters were as follows: mass flow rate of methane was 8%; growth temperature was 600° C.; growth pressure was 3000 Pa; plasma current density was 5 mA/cm$^2$; magnetic field intensity was 500 Gs; growth time was 30 min. A three-dimensional network skeleton of carbon nanotube coated graphene on the nickel-iron foam substrate was obtained. The carbon nanotube coated foamed diamond skeleton was placed in the mold, serving as a bulk reinforcement to be compounded with the matrix according to step (5). (7) Impregnation curing was used to perform compounding through: a) Preparation of silicone rubber precursor solution: weighing 20 g silicone rubber precursor, mixing it with a curing agent at mass ratio of 10:1, and the mixture was mixed with an organic solvent ethyl acetate at a mass ratio of 1:9. Then stirring vigorously for about 5 min, and the mixture was degassed for 5 min to remove bubbles therein. Finally, an ethyl acetate solution of the silicone rubber precursor was obtained. b) Mixing: the three-dimensional network skeleton of graphene/carbon nanotube was placed in the mold, and the silicone rubber precursor solution was dropped into it at volume ratio of 2:1, so that the solution can fully infiltrate into the macroscopic diamond to obtain the mixture. c) Vacuum treatment: the above mixture was degassed under vacuum for 2 h to remove the solvent and bubbles and make the silicone rubber precursor solution better impregnated into the pores of the diamond network. d) After being heated to 80° C. and cured for 4 h, the silicone rubber composite reinforced with the foamed graphene/carbon nanotube skeleton was obtained, and the thermal conductivity of the composite was 254 W/(m·K).

Example 15: PMMA Composite Reinforced with Foamed Diamond/Graphene/Carbon Nanotube Skeleton In this example of PMMA composite reinforced with foamed diamond/graphene/carbon nanotube skeleton, a copper foam was used as a substrate having a pore diameter of 0.3 mm. The volume fraction of the foamed graphene reinforcement was 40%. Firstly, the copper foam three-dimensional network substrate was cleaned according to step (1). Then, according to step (2), a molybdenum film, as an intermediate transition layer and with a thickness of 50 nm, was deposited on the surface of three dimensional network skeleton of the copper foam by magnetron sputtering technique. Then, according to step (3), the foamed skeleton substrate with a large amount of nano-crystalline and micro-crystalline diamond particles in pores was obtained. According to step (4), a diamond film was deposited by hot filament CVD. The deposition parameters were as follows: filament-to-substrate distance was 6 mm; substrate temperature was 800° C.; hot filament temperature was 2200° C.; deposition pressure was 3 kPa; the volume flow ratio of $CH_4/H_2$ was 1:99, the thickness of the as-deposited diamond film can be controlled at 800 μm by tuning the CVD deposition time, and a three-dimensional network skeleton of diamond on the copper foam substrate was obtained. Then the graphene film was deposited by hot wall CVD, and specifically: the sample was heated to 950° C. in an atmosphere of $H_2$ and Ar (flow rate: $H_2$ was 200 mL/min and Ar was 500 mL/min respectively, heating rate was 33° C./min), and was heat treated for 10 min after the furnace temperature was raised to 950° C.; after the heat treatment, the mixture gas of $CH_4$, $H_2$ and Ar was introduced (flow rate: $CH_4$ was 5 mL/min, $H_2$ was 200 mL/min and Ar was 500 mL/min respectively), and the graphene was grown; cooling rate was 100° C./min; deposition time was 3 h; and a three-dimensional network skeleton of diamond/graphene on the copper foam substrate was obtained. Then a layer of nickel was deposited onto the surface of the graphene through magnetron sputtering technique. Next, carbon nanotubes were catalytically grown on the surface of the graphene by plasma-assisted chemical vapor deposition technique. Meanwhile, the orientation of the carbon nanotube growth was controlled by the applied electric field to form carbon nanotube forests perpendicular to the surface of graphene. Then the three-dimensional network skeleton of diamond/graphene/carbon nanotubes on the copper foam substrate was obtained. The deposition parameters were as follows: mass flow rate of methane was 10%; growth temperature was 600° C.; growth pressure was 3000 Pa; plasma current density was 5 mA/cm², magnetic field intensity was 500 Gs; growth time was 2 h. After that, before being compounded with a matrix material, a layer of tungsten film was in-situ evaporated onto the surface of foamed diamond skeleton for surface modification by vacuum evaporation method according to step (5). (6) The foamed diamond skeleton coated with tungsten film was placed in a mold to serve as a sheet-like reinforcement to be compounded with a matrix in parallel arrangement. (7) A polymethyl methacrylate (PMMA) chloroform solution was dripped at a volume ratio of 1:1, making the solution fully infiltrate into the foamed diamond skeleton to obtain a mixture. The above mixture was dried under vacuum oven at 60° C. for 24 h to remove the chloroform solvent, and was then heated to 110° C. After being kept for 1 h, then the sample was cooled to room temperature. Finally, the PMMA composite reinforced with foamed diamond/graphene/carbon nanotube skeleton was obtained, and the thermal conductivity of this composite was 567 W/(m·K).

In this invention, the embodiments of paraffin wax matrix composites were prepared according to the process or steps as follows:

(1) A foamed skeleton is placed in ethanol for ultrasonic cleaning, and dried for use.

(2) An intermediate transition layer is deposited on the surface of the foamed skeleton through a method selected from one of electroplating, electroless plating, evaporation, magnetron sputtering, chemical vapor deposition and physical vapor deposition; wherein the intermediate transition layer is selected from one of nickel, copper, tungsten, molybdenum, titanium, silver, chromium, or a composite metal layer.

(3) The nano-crystalline and micro-crystalline diamond mixture particles, the foamed skeleton substrate, and the solvent are mixed and heated to boil. Then, the mixture is cleaned under the high-power ultrasonic oscillation for 30 minutes. After ultrasonic dispersion uniformly, the foamed skeleton is taken out and dried. The substrate of the foamed skeleton with a large amount of nano-crystalline and micro-crystalline diamond particles in pores was obtained.

(4) A continuous and dense reinforcing layer is deposited on the metal substrates by hot filament chemical vapor deposition; wherein the reinforcing layer is selected from at least one of diamond film, graphene film, carbon nanotube film, graphene coated diamond, carbon nanotube coated diamond, carbon nanotube coated graphene and carbon nanotube/graphene coated diamond.

(5) The foamed skeleton reinforcement can be distributed in a matrix after surface modification according to the following three arrangements:

a. The foamed skeleton serves as a bulk reinforcement to be compounded with a phase change material. The whole composite presents an interpenetrated network configuration of highly thermal conductivity reinforcing layer/phase change material.

b. The foamed diamond skeleton serves as a sheet-like reinforcement to be compounded with a phase change material. The reinforcement is arranged in the matrix in parallel.

c. The foamed diamond skeleton serves as a strip-like reinforcement to be compounded with a phase change material. The reinforcement is arranged in the matrix in parallel.

(6) The foamed skeleton with the reinforcing layer is compounded with a phase change material through vacuum impregnation and curing, or other techniques.

Example 16: Paraffin Phase Change Materials Reinforced with Diamond Foam

In this example, copper foam was used as a substrate having a pore diameter of 0.3 mm and a porosity of 20%, the volume fraction of the foamed diamond reinforcement in composite was 40%. Firstly, the three-dimensional network of copper foam substrate was cleaned according to step (1). Then, according to step (2), a chromium film, as an intermediate transition layer and with a thickness of 50 nm, was deposited on the surface of three dimensional network foamed copper skeleton by magnetron sputtering technique. And according to step (3), the foamed skeleton substrate with a large amount of nano-crystalline and micro-crystalline diamond particles in pores was obtained. According to step (4), a diamond film was deposited by hot filament CVD. The deposition parameters were as follows: filament-to-substrate distance was 6.0 mm; substrate temperature was 800° C.; filament temperature was 2200° C.; deposition pressure was 3.0 kPa; the volume flow ratio of $CH_4/H_2$ was 1:99. The thickness of the diamond film can be controlled at 30 μm. Then the three dimensional network skeleton of diamond on the copper foam substrate was obtained. (5) The foamed diamond skeleton was placed in a mold and served as a sheet-like reinforcement to be compounded with a matrix in parallel arrangement. (7) The foamed diamond skeleton was placed into paraffin at a volume ratio of 1:5 at 90° C., after the paraffin fully infiltrated into the foamed diamond skeleton, a mixture was obtained. The above mixture was degassed under vacuum for 0.5 h at 100° C. to remove the bubbles therein, and making the paraffin to better impregnate into the pores of the diamond network. The temperature was continuously held for 1 h at 100° C. After being cooled to room temperature, the paraffin phase-change energy-storage composites reinforced with foamed diamond skeleton was obtained, and the thermal conductivity of the composite was 19.78 W/(m·K).

Example 17: Paraffin Phase Change Materials Reinforced with Diamond Foam

In this example, copper foam was used as a substrate having a pore diameter of 0.2 mm and a porosity of 50%. The volume fraction of foamed diamond reinforcement in composite was 20%. Firstly, the three-dimensional network of a copper foam substrate was cleaned according to step (1). Then, according to step (2), a chromium film, as an intermediate transition layer and with a thickness of 50 nm, was deposited on the surface of three-dimensional network foamed copper skeleton by magnetron sputtering technique. And according to step (3), the foamed skeleton substrate with a large amount of nano-crystalline and micro-crystalline diamond particles in pores was obtained. According to step (4), a diamond film was deposited by hot filament CVD. The deposition parameters were as follows: filament-to-substrate distance was 6 mm; substrate temperature was 800° C.; filament temperature was 2200° C.; deposition pressure was 3 kPa; the volume flow ratio of $CH_4/H_2$ was 1:99. The thickness of the diamond film was controlled at 100 μm. Then a three-dimensional network diamond skeleton on the copper foam substrate was obtained. (5) The foamed diamond skeleton was placed in a mold and served as a sheet-like reinforcement to be compounded with a matrix in parallel arrangement. (7) The foamed diamond skeleton was placed into the paraffin at a volume ratio of 1:5 at 90° C. After the paraffin fully infiltrated into the foamed diamond skeleton, a mixture was obtained. The above mixture was degassed under vacuum for 0.5 h at 100° C. to remove the bubbles therein and make the paraffin better impregnate into the pores of the diamond network. The sample was continuously kept for 1 h at 100° C. Finally, after being cooled to room temperature, the paraffin phase-change energy-storage composites reinforced with the foamed diamond skeleton was obtained. The thermal conductivity of this composite was 36.51 W/(m·K).

Example 18: Paraffin Phase-Change Energy-Storage Materials Reinforced with Copper Foam In this example, a copper foam was used as a substrate having a pore diameter of 0.2 mm and a porosity of 50%. The volume fraction of the foamed diamond reinforcement in the composite was 20%. Firstly, the three-dimensional network of copper foam substrate was cleaned according to step (1). (2) The foamed copper skeleton was placed in a mold and served as a sheet-like reinforcement to be compounded with a matrix in parallel arrangement. The foamed copper skeleton was placed into the paraffin at a volume ratio of 1:5 at 90° C. After the paraffin fully infiltrated into the foamed copper skeleton, a mixture was obtained. The above mixture was degassed in vacuum for 0.5 h at 100° C. to remove the bubbles therein and make the paraffin better impregnate into the pores of the diamond network. And the sample was continuously kept for 1 h at 100° C. Finally, after being cooled to room temperature, the paraffin phase change composites reinforced with copper foam was obtained. The thermal conductivity of the composite was 4.73 W/(m·K).

Example 19: Paraffin Phase Change Composite Reinforced with Nickel Foam

Paraffin phase change composite reinforced with nickel foam in this example, nickel foam was used as a reinforcement having a pore size of 0.2 mm and a porosity of 50%. The volume fraction of nickel foam in composite was 20%. Firstly, the nickel foam was cleaned according to step (1). (2) Then, the nickel foam was set in the mold, serving as a sheet-like reinforcement to be compounded with the matrix in parallel arrangement. (6) Afterwards, the nickel foam was covered with paraffin that was 5 times in the volume at 90° C., making the paraffin wax fully infiltrate the nickel foam, and a mixture was obtained. The mixture was degassed under vacuum at 100° C. for 0.5 h, removing the bubbles and making the paraffin better impregnate to the pores of the nickel network. Next, the sample was kept at 100° C. for 1 h. Finally, after being cooled to room temperature, paraffin phase-change energy-storage composite reinforced with the nickel foam was obtained. The thermal conductivity of the composite was 1.64 W/(m·K).

Example 20: Paraffin Phase-Change Energy-Storage Materials Reinforced with Diamond/Graphene Foam In this example, a copper foam was used as a substrate having a pore size of 0.2 mm. The volume fraction of the diamond foam in the composite was 40%. Firstly, the three-dimensional substrate of the copper foam was cleaned according to step (1). Then, a chromium film, as an intermediate transition layer and with a thickness of 300 nm, was in-situ evaporated on the surface of the copper foam substrate by vacuum evaporation method according to step (2). According to step (3), the foamed skeleton substrate with a large amount of nano-crystalline and micro-crystalline diamond particles in pores was obtained. According to step (4), diamond film was deposited by hot filament CVD. The deposition parameters were as follows: filament-to-substrate distance was 6 mm; substrate temperature was 850° C.; filament temperature was 2200° C.; deposition pressure was 3 kPa; the volume flow ratio of $CH_4/H_2$ was 1:99. The thickness of the as-deposited diamond film was controlled at 100 μm. A three-dimensional network skeleton of diamond on the copper foam substrate was obtained. Afterwards, a graphene layer was in-situ grown on the surface of diamond substrate by plasma-assisted chemical vapor deposition technique. The plasma was confined to the near surface of the diamond by adding a magnetic field at the bottom of the substrate to increase the plasma bombardment to the surface of the substrate. Deposition parameters were as follows: the substrate temperature was 800° C.; the deposition pressure was 5.0 kPa; the volume flow ratio of $CH_4/H_2$ was 1:99; the plasma current density was 15 mA/cm$^2$; the magnetic field intensity was 500 Gs; the deposition time was 30 min. At the same time, the orientation of the graphene growth was controlled by the applied electric field to make the graphene form graphene walls perpendicular to the surface of diamond. The reinforcing layer of the graphene-coated diamond film was obtained, and the three-dimensional network skeleton of the graphene coated diamond on the nickel foam substrate was obtained. (5) Then the foamed diamond skeleton coated by graphene was set in the mold, serving as a strip-like reinforcement to be compounded with the matrix in parallel arrangement. According to step (6), the foamed diamond skeleton was placed in the paraffin at a volume ratio of 2:3. Then the oven temperature was set to 90° C. After making the paraffin wax fully infiltrate the foamed diamond skeleton, a mixture was obtained. The mixture was degassed under vacuum at 100° C. for 0.5 h to remove the bubbles and make the paraffin better impregnated into the pores of the diamond network. Next, the sample was kept at 100° C. for 1 h. Finally, after being cooled to room temperature, a paraffin phase-change energy-storage composite reinforced with diamond/graphene foam was obtained. The thermal conductivity of the composite was 47.49 W/(m·K).

Example 21: Paraffin Composite Reinforced with Diamond/Graphene/Carbon Nanotube Foam In this example, a copper foam was used as a substrate having a pore size of 0.2 mm. The volume fraction of foamed diamond reinforcement in composite was 40%. Firstly, the copper foam substrate was cleaned according to step (1). Next, a chromium film, as an intermediate transition layer with a thickness of about 500 nm, was sputtered onto the surface of the three-dimensional network skeleton of the copper foam through magnetron sputtering method according to step (2). According to step (3), the foamed skeleton substrate with a large amount of nano-crystalline and micro-crystalline diamond particles in pores was obtained. According to step (4), a diamond film was deposited by hot filament CVD. The deposition parameters were as follows: filament-to-substrate distance was 6 mm; substrate temperature was 800° C.; filament temperature was 2200° C.; deposition pressure was 3 kPa; the volume flow ratio of $CH_4/H_2$ was 1:99. The thickness of the as-deposited diamond film was controlled at 500 µm. After the deposition, a three-dimensional network skeleton of diamond on the copper foam substrate was obtained. Then a graphene film was then in-situ deposited on the surface of the diamond foam by hot-wall CVD. The process parameters were as follows: the sample was heated to 950° C. (heating rate was 33° C./min) in an atmosphere of $H_2$ and Ar (flow rate: $H_2$ was 200 mL/min and Ar was 500 mL/min respectively), and was heat treated for 10 min; then the mixture gas of $CH_4$, $H_2$ and Ar was introduced (flow rate: $CH_4$ was 5 mL/min, $H_2$ was 200 mL/min and Ar was 500 mL/min respectively) to grow the graphene. The cooling rate was 100° C. min; the growth time was 3 h. After the deposition, a three-dimensional network skeleton of diamond/graphene on copper foam was obtained. And a nickel film was deposited onto the surface of the graphene through magnetron sputtering. The carbon nanotubes were catalytically grown on the surface of the graphene by plasma-assisted chemical vapor deposition technique. Then the orientation of the carbon nanotube growth was controlled by the applied electric field to make carbon nanotubes form carbon nanotube forests perpendicular to the surface of graphene. A three-dimensional network skeleton of the foamed diamond/graphene/carbon nanotube was obtained. Deposition parameters were as follows: mass flow rate of methane was 10%; growth temperature was 600° C.; growth pressure was 3 kPa; plasma current density was 5 mA/cm$^2$; magnetic field intensity was 500 Gs; growth time was 2 h. Then, the foamed skeleton coated with diamond/graphene/carbon nanotube on the surface was placed in a mold and served as a sheet-like reinforcement to be compounded with a matrix in parallel arrangement. According to step (6), the foamed skeleton was placed in paraffin at a volume ratio of 2:3. Then the oven temperature was set to 90° C., making the paraffin wax fully infiltrated the foamed diamond skeleton, and a mixture was obtained. The mixture was degassed under vacuum at 100° C. for 0.5 h, removing the bubbles and making the paraffin better impregnated to the pores of the diamond network. Finally, the sample was kept at 100° C. for 1 h and was then cooled to room temperature. A paraffin phase-change energy-storage material reinforced with foamed diamond/graphene/carbon nanotube skeleton was obtained, and the thermal conductivity of the composite was 79.38 W/(m·K).

Example 22: Ba(OH)$_2$.8H$_2$O Phase Change Composite Reinforced with Foamed Diamond Skeleton In this example, a porous nickel was used as a substrate having a pore diameter of 2 mm. The volume fraction of the foamed diamond reinforcement in composite was 40%. Firstly, the nickel foam substrate was cleaned according to step (1). Then, according to step (2), a tungsten film, as an intermediate transition layer with a thickness of about 200 nm, was deposited onto the surface of nickel foam substrate by magnetron sputtering method. According to step (3), the substrate of the foamed skeleton with a large amount of nano-crystalline and micro-crystalline diamond particles in pores was obtained. According to step (4), a diamond film was deposited by hot filament CVD. Deposition process parameters were as follows: the filament-to-substrate distance was 6 mm; the substrate temperature was 800° C.; the filament temperature was 2200° C.; the deposition pressure was 3 kPa; the volume flow ratio of $CH_4/H_2$ was 1:99. The thickness of the as-deposited diamond film was kept at 300 µm. After the deposition, a three-dimensional network skeleton of diamond on the nickel foam substrate was obtained. Then, the foamed diamond skeleton was placed in a mold and served as a sheet-like reinforcement to be compounded with the matrix in parallel arrangement. According to step (6), the foamed diamond skeleton was put into Ba(OH)$_2$.8H$_2$O at a volume ratio of 2:3. After making the paraffin wax fully infiltrated the foamed diamond skeleton, a mixture was obtained. The mixture was degassed under vacuum at 100° C. for 0.5 h to remove the bubbles and making the paraffin better impregnated into the pores of the diamond network. Finally, the sample was kept at 100° C. for 1 h and was then cooled to room temperature. A paraffin phase-change energy-storage material reinforced with the foamed diamond skeleton was obtained, and the thermal conductivity of the composite was 9.59 W/(m·K).

Example 23: Epoxy Resin Composite Reinforced with Foamed Nitrogen-Doped Diamond Skeleton In this example of epoxy resin composite reinforced with foamed nitrogen-doped diamond skeleton, a copper foam was used as a substrate having a pore diameter of 0.3 mm. The volume fraction of the diamond foam in the composite was 20%. Firstly, the copper foam substrate was cleaned according to step (1). Then, according to step (2), a chromium film, as an intermediate transition layer with a thickness of about 50 nm, was sputtered onto the surface of the copper foam substrate by magnetron sputtering method. According to step (3), the substrate of the foamed skeleton with a large amount of nano-crystalline and micro-crystalline diamond particles in pores was obtained. According to step (4), nitrogen-doped diamond film was deposited by hot filament CVD. Deposition process parameters were as follows: the filament-to-substrate distance was 6 mm; the substrate temperature was 2200° C.; the deposition pressure was 3 kPa; the nitrogen source was $N_2$; the volume flow ratio of $N_2/CH_4/H_2$ was 0.2:1:99. The thickness of the as-deposited diamond film was kept at 60 µm by tuning the CVD diamond deposition time. A three-dimensional network skeleton of nitrogen-doped diamond on copper foam was obtained. Then, the foamed nitrogen-doped diamond skeleton was placed in a mold and served as a sheet-like reinforcement to be compounded with a matrix in parallel arrangement. Afterwards, the mixture was obtained through dripping the bisphenol F epoxy resin precursor solution (a curing agent was diaminodiphenyl (DDM)) into the foamed skeleton at a volume ratio of 1:1, making the paraffin wax fully infiltrated the foamed diamond skeleton, and a mixture was obtained. The mixture was degassed under vacuum for 2 h to remove the bubbles and make the resin precursor solution better impregnate to the pores of the diamond network. Step heating and curing was performed at 100° C. for 2 h, and then raised to 160° C. for 4 h. Finally, after being cooled to room temperature, a bisphenol F epoxy resin matrix composite reinforced with the foamed diamond skeleton was obtained. The thermal conductivity of the composite was 128 W/(m·K).

According to the thermal conductivity data in the above embodiments, the thermal conductivity of the composite material reinforced with a foamed skeleton prepared by the present invention was greatly improved. The thermal conductivity of the metal matrix composites was up to 976 W/(m·K), and the polymer matrix composites was up to 567 W/(m·K). The thermal conductivity of the paraffin phase change material reinforced with the foamed diamond skeleton, which was up to 79.38 W/(m·K), which was greatly improved compared to paraffin phase change material reinforced with the metal foam. The paraffin phase change material reinforced with the foamed diamond skeleton also has better comprehensive performance than the traditional phase-change energy-storage material. The spatially continuous interpenetrated structure of the foamed skeleton reinforcement and the matrix prepared by the invention can effectively weaken the influence of interface on the thermal properties of materials. It can not only maintain the good plasticity and toughness of the matrix, but also make the reinforcement phase as a whole to maximize the potential of the thermal conductivity, electrical conductivity and excellent mechanical properties of the reinforcement, leading to extremely improved thermal conductivity, electrical conductivity and mechanical strength compared to traditional composite materials and apparently superior comprehensive performance to traditional metal-matrix or polymer-matrix composites. Such a composite possesses much better potential to be utilized as a kind of multifunctional material.

Example 24: Carbon Nanotube/Graphene

In this example of silicone rubber composite reinforced with a foamed carbon nanotubes/graphene skeleton, a Ni—Fe foam was used as a substrate having a pore diameter of 1 mm. The volume fraction of the foamed graphene reinforcement in the composite was 7%. Firstly, the Ni—Fe foam was cleaned according to step (1). Next, carbon nanotubes were in-situ deposited on the surface of the substrate with no intermediate transition layer by chemical vapor deposition. According to step (4), the carbon nanotubes were catalytically grown on the surface of the graphene by plasma-assisted chemical vapor deposition. Meanwhile, the orientation of the carbon nanotube growth was controlled by the applied electric field, making carbon nanotube form carbon nanotube forests perpendicular to the surface of the graphene. Then a reinforcing layer of carbon nanotubes coated graphene films was obtained. Process parameters are as follows: the mass flow rate of methane was 8%; the deposition temperature was 600° C.; the deposition pressure was 3000 Pa; the plasma current density was 5 mA/cm$^2$; the magnetic induction intensity was 500 Gs; the deposition time was 30 min. Then the graphene film was deposited by hot-wall CVD, and Specifically, the sample was heated to 950° C. in an atmosphere of $H_2$ and Ar (flow rate: $H_2$ was 200 mL/min and Ar was 500 mL/min respectively, heating rate was 33° C./min), and was heat treated for 10 min after the furnace temperature was raised to 950° C. After the heat treatment, the mixture gas of $CH_4$, $H_2$ and Ar was introduced (flow rate: $CH_4$ was 5 mL/min, $H_2$ was 200 mL/min and Ar was 500 mL/min respectively), and the graphene was grown; cooling rate was 100° C./min; deposition time was 2 h. A three-dimensional network skeleton of graphene coated carbon nanotube on the Ni—Fe foam was obtained. Then, the foamed skeleton of graphene coated carbon nanotube was placed in a mold and served as a bulk reinforcement to be compounded with the matrix.

(7) The composite was prepared by impregnation curing: a) Preparation of silicone rubber precursor fluid: weighing 20 g silicone rubber precursor, mixing it with a curing agent at a mass ratio of 10:1, and the mixture was mixed with an organic solvent of ethyl acetate at a mass ratio of 1:9, and then stirring vigorously for about 5 min, and the mixture was subjected to vacuum treatment for 5 min to remove bubbles therein. Finally, an ethyl acetate solution of the silicone rubber precursor was obtained. b): Mixing: three-dimensional network skeleton of graphene-coated carbon nanotube was put in a mold. Then the silicone rubber precursor solution was dripped into the graphene/carbon nanotube skeleton at a volume ratio of 2:1, making the solution fully infiltrate into the macroscopic diamond to obtain the mixture. c) Vacuum treatment: the above mixture was degassed under vacuum for 2 h to remove the solvent and bubbles therein and making the silicone rubber precursor solution better impregnate into the pores of the diamond network. d) Heating to 80° C., and insulatingly curing for 4 h, a silicone rubber matrix composite reinforced with graphene foam/carbon nanotube was obtained. The thermal conductivity of the composite was 139 W/(m·K).

What is claimed is:

1. A composite material comprising:
   a foamed skeleton having pores, wherein a material of the foamed skeleton is a metal material;
   a matrix, wherein a material of the matrix is a metal material;
   reinforcing particles distributed in the pores of the foamed skeleton, wherein the reinforcing particles are thermal conductivity particles, super-hard and wear-resistant particles, electrical conductivity particles, or any combinations thereof,
   wherein the volume fraction of the matrix is 10-90%, the volume fraction of the foamed skeleton is 5-80%, and the volume fraction of the reinforcing particles is 0-30%, and
   wherein the foamed skeleton comprises a plurality of sheets or strips arranged in a parallel fashion in the matrix to reinforce the matrix in a multi-body way; and
   a reinforcing layer on the foamed skeleton, wherein the reinforcing layer is a laminate of diamond film/graphene film/carbon nanotube film.

2. The composite material of claim 1, wherein the metal material of the matrix is selected from a group consisting of Al, Cu, Mg, Ag, Ti, Co, Ni, W, Mo, Ta, Nb, and any alloys thereof.

3. The composite material of claim 1, wherein the metal material of the foamed skeleton is Ni, Cu, Ti, Co, W, Mo, Cr, Fe Ni or Al.

4. The composite material of claim 1, Wherein the laminate of diamond film/graphene film/carbon nanotube film is formed by growing graphene on a diamond film and then catalytically growing carbon nanotubes on the graphene film, the graphene is parallel to the diamond film to form a graphene and the carbon nanotubes are perpendicular to the diamond film to form a carbon nanotube forest.

5. The composite material of claim 1, further comprising an intermediate transition layer between the foamed skeleton and the reinforcing layer, wherein a material of the intermediate transition layer is Nb, Ti, Ni, W, Mo, Cr, Ta, Pt, Ag, Si, or any combinations thereof.

6. The composite material of claim 1, further comprising a modifying layer on the reinforcing layer, wherein a material of the modifying layer is a metal selected from W, Mo, Cr, Ti, Ni, Cu, Al and Pt, a metal carbide selected from tungsten carbide, molybdenum carbide, chromic n carbide and titanium carbide, or an alloy selected from a tungsten alloy, a molybdenum alloy, a chromium alloy, a titanium alloy, a nickel alloy, a copper alloy, an aluminum alloy and a platinum alloy.

7. The composite material of claim 1, wherein the pores of the foamed skeleton have a diameter of 0.01-10 mm, a porosity of the foamed skeleton is 40-99%, and the foamed skeleton is a planar structure or a three dimensional structure.

8. The composite material of claim 1, wherein the thermal conductivity particles are selected from at least one of diamond powders, graphene, carbon nanotubes, graphene coated diamond microspheres, carbon nanotube coated diamond microspheres, and carbon nanotube coated graphene, the super-hard and wear-resistant particles are selected from at least one of the diamond powders, SiC, TiC, TiN, AlN, $Si_3N_4$, $Al_2O_3$, BN, WC, MoC and $Cr_7C_3$, and the conductive electrical conductivity particles are selected from at least one of graphite, carbon nanotubes, and graphene.

9. A method of preparing the composite material according to claim 1, the method comprising:

providing a matrix, wherein a material of the matrix is a metal material;

cleaning a foamed skeleton having pores, wherein a material of the foamed skeleton is a metal material, reinforcing particles distributed in the pores of the foamed skeleton, wherein the reinforcing particles are thermal conductivity particles, super-hard and wear-resistant particles, electrical conductivity particles, or any combinations thereof, and wherein the volume fraction of the matrix is 10-90%, the volume fraction of the foamed skeleton is 5-80%, and the volume fraction of the reinforcing particles is 0-30%;

depositing an intermediate transition layer on the foamed skeleton by electroplating, electroless plating, evaporation, magnetron sputtering, chemical vapor deposition (CVD), or physical vapor deposition (PVD), wherein the intermediate transition layer is a layer of Nb, Ni, Cu, W, Ti, Ag, Cr, or any combinations thereof;

depositing a reinforcing layer on the intermediate transition layer, wherein the reinforcing layer is a laminate of diamond film/graphene film/carbon nanotube film; and compounding the foamed skeleton with the reinforcing particles and the matrix such that the foamed skeleton comprises a plurality of sheets or strips arranged in a parallel fashion in the matrix.

10. The method of claim 9, wherein the reinforcing layer is deposited by plasma enhanced CVD to increase the deposition rate and control the growing direction, and wherein the laminate of diamond film/graphene film/carbon nanotube film is formed by growing graphene on a diamond film and then catalytically growing carbon nanotubes on the graphene film, the graphene is parallel to the diamond film to form a graphene, film, and the carbon nanotubes are perpendicular to the diamond film to form a carbon nanotube forest.

11. The method of claim 9, wherein the compounding step comprises:

depositing a modifying layer on the reinforcing layer by plating, evaporation, magnetron sputtering, chemical vapor deposition or physical vapor deposition, wherein the modifying layer is a metal selected from W, Mo, Cr, Ti, Ni, Al and Pt, a metal carbide selected from tungsten carbide, molybdenum carbide, chromium carbide and titanium carbide, or an alloy selected from a tungsten alloy, a molybdenum alloy, a chromium alloy, a titanium alloy, a nickel alloy, a copper alloy, an aluminum alloy and a platinum alloy; and compounding the foamed skeleton with reinforcing particles and the matrix by pressure infiltration, pressure-free infiltration, or vacuum suction casting.

* * * * *